(12) United States Patent
Tung et al.

(10) Patent No.: US 12,538,534 B2
(45) Date of Patent: Jan. 27, 2026

(54) SEMICONDUCTOR STRUCTURE

(71) Applicant: Taiwan Semiconductor Manufacturing Company, Ltd., Hsinchu (TW)

(72) Inventors: Yu-Lung Tung, Kaohsiung (TW); Xiaodong Wang, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 385 days.

(21) Appl. No.: 18/346,372

(22) Filed: Jul. 3, 2023

(65) Prior Publication Data
US 2025/0015130 A1 Jan. 9, 2025

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 62/13* | (2025.01) |
| *H10D 64/01* | (2025.01) |
| *H10D 84/85* | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/151* (2025.01); *H10D 64/017* (2025.01); *H10D 84/85* (2025.01)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 * | 12/2016 | Chang .................. H10D 84/038 |
| 9,536,738 B2 * | 1/2017 | Huang ................. H10D 62/122 |

(Continued)

*Primary Examiner* — Bilkis Jahan
(74) *Attorney, Agent, or Firm* — McClure, Qualey & Rodack, LLP

(57) ABSTRACT

A semiconductor structure is provided. A logic cell includes first and second nanostructure transistors. The first nanostructure transistor is formed in a first active region over a first well region having a first conductivity type. The second nanostructure transistor is formed in a second active region over a second well region having a second conductivity type. The first and second nanostructure transistors share a gate structure. First and second source/drain features of the first nanostructure transistor are formed in the first active region. Third and fourth source/drain features of the second nanostructure transistor are formed in a first portion and a second portion of the second active region, respectively. A first distance between the first active region and the first portion of the second active region is different from a second distance between the first active region and the second portion of the second active region.

20 Claims, 19 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 2021/0202742 A1* | 7/2021 | Huang ................. H10D 62/119 |

* cited by examiner

SEMICONDUCTOR STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

For example, as IC technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. MBC transistors with sheet-like channel members generally provide superior gate control and drive current, their wider sheet-like channel members may increase device widths.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
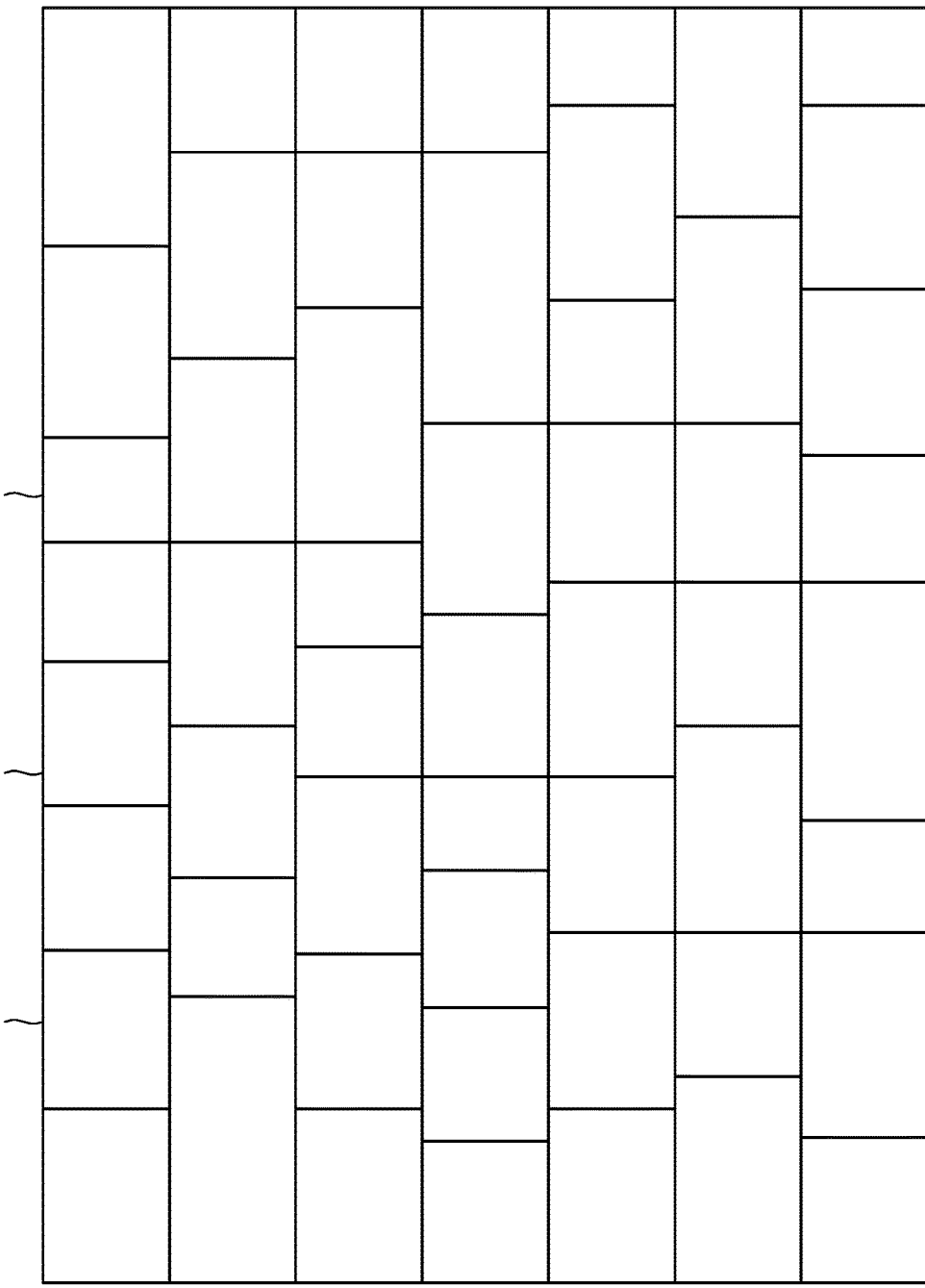
FIG. 1 is a simplified diagram of a cell array, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

The present disclosure is generally related to semiconductor devices, and more particularly to circuit cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The nanostructure transistor (e.g., nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. The details of the present disclosure are described below in conjunction with the accompanying drawings, which illustrate the layout and structure of logic cells, according to some embodiments.

An integrated circuit (IC) includes various circuits and/or memories. In the IC, the circuit may be a logic circuit configured to perform a specific function or operation. The circuit includes multiple logic cells. In some embodiments, the logic cell may be a standard cell (STD cell). The logic cells are arranged in multiple rows and multiple columns of a cell array. In some embodiments, the logic cells are the standard cells (e.g., inverter (INV), AND, OR, NAND, NOR, Flip-Flop, SCAN, etc.), a combination thereof or specific functional cells. The logic cells may have various cell heights and cell widths. Furthermore, the logic cells arranged in the same rows may have the same cell height. Moreover, each logic cell includes multiple transistors, i.e., PMOS and NMOS transistors.

The NMOS and/or PMOS transistors are formed in oxide definition (OD) regions. The OD region, sometimes labeled as an "oxide diffusion" area, defines an active region (or device region) for the transistor, i.e., the region where the source, drain and channel under the gate of transistor are formed. The active region is defined to be between inactive areas, such as shallow trench isolation (STI) or field oxide (FOX) region.

FIG. 1 is a simplified diagram of a cell array 100, in accordance with some embodiments of the disclosure. The cell array 100 includes multiple cells 15, and the cells 15 are arranged in multiple rows in a circuit region 10. In the embodiment, the cells 15 are logic cells (or the standard cells), such as inverter (INV), AND, OR, NAND, NOR, Flip-Flop, SCAN and so on. In FIG. 1, the cells 15 of the cell array 100 have the same cell height in the Y-direction. In some embodiments, the logic cells 15 in the same row have the same cell height in the Y-direction, and the rows of the cell array 100 may have various cell height in the Y-direction. Furthermore, the P-type transistors and the N-type transistors in the cells 15 are formed by nanostructure transistors.

Figure 2:
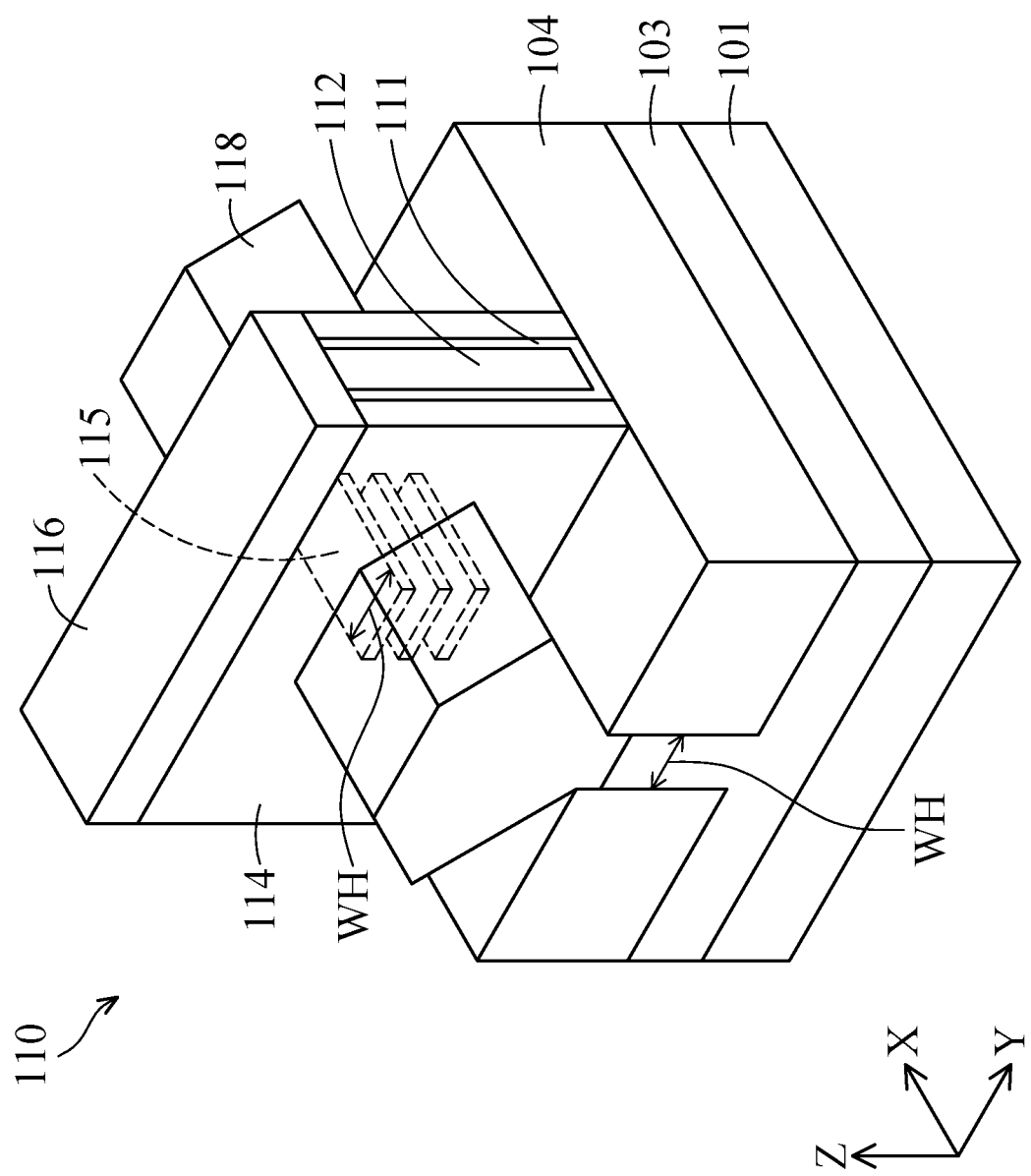
FIG. 2 is a perspective view of an exemplary GAA transistor.

FIG. 2 is a perspective view of an exemplary GAA transistor. The GAA transistor includes a substrate 101. The substrate 101 includes a semiconductor material, such as bulk silicon (Si). In some embodiments, the substrate 101 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 101 may also include an insulating layer, such as a silicon oxide layer, to have a silicon-on-insulator (SOI) structure or a germanium-on-insulator (GOI) structure. In some embodiments, after the resultant GAA transistor is formed, the substrate 101 may be removed by a suitable process (e.g., a chemical mechanical polishing (CMP) process) for forming back-side interconnections.

The GAA transistor also includes one or more nanostructures 115 (dash lines) extending in the X-direction and vertically arranged (or stacked) in a Z-direction. More specifically, the nanostructures 115 are spaced from each other in the Z-direction, and has a width of WH in the Y-direction. In some embodiments, the nanostructures 115 may also be referred to as channels, channel layers, nanosheets, or nanowires. The nanostructures 115 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 115 include silicon for N-type GAA transistors. In other embodiments, the nanostructures 115 include silicon germanium for P-type GAA transistors. In some embodiments, the nanostructures 115 are all made of silicon, and the type of GAA transistors depend on work function metal layer wrapping around the nanostructures 115.

The GAA transistor further includes a gate structure 110 including a gate electrode 112 and a gate dielectric layer 111. The gate dielectric layer 111 wraps around the nanostructures 115, and the gate electrode 112 wraps around the gate dielectric layer 111 (not shown). The gate electrode 112 may include polysilicon or work function metal. The work function metal includes TiN, TaN, TiAl, TiAlN, TaAl, TaAlN, TaAlC, TaCN, WNC, Co, Ni, Pt, W, a combination thereof, or another suitable material.

In some embodiments, the gate electrode 112 may include a capping layer, a barrier layer, an n-type work function metal layer, a p-type work function metal layer, and a fill material (not shown). In some embodiments, the P-type transistors and the N-type transistors are formed of the same work function material. In some embodiments, the P-type transistors and the N-type transistors are made of different work function materials.

The gate dielectric layer 111 may include dielectric materials, such as silicon oxide, silicon nitride, silicon oxynitride, a dielectric material with high dielectric constant (high-k), or a combination thereof. Examples of high-k dielectric materials include TiO2, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, and other suitable materials.

The gate spacers 114 are disposed on sidewalls of the gate dielectric layer 111 and over the nanostructures 115 (not shown). The gate spacers 114 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 114 may include a single layer or a multi-layer structure.

The gate top dielectric layer 116 is over the gate dielectric layer 111, the gate electrode 112, and the nanostructures 115. The gate top dielectric layer 116 is used for contact etch protection layer. The material of gate top dielectric layer 116 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), a combination thereof, or another suitable material.

The GAA transistor further includes the epitaxially-grown materials 118. As shown in FIG. 2, two epitaxially-grown materials 118 are on opposite sides of the gate structure 110. The epitaxially-grown materials 118 serve as the source/drain features of the GAA transistor. Therefore, the epitaxially-grown materials 118 may also be referred to as source/drain, source/drain features, or source/drain nodes. In some embodiments, for an N-type GAA transistor, the epitaxially-grown materials 118 may include SiP, SiC, SiPC, SiAs, Si, or a combination thereof. In some embodiments, for a P-type GAA transistor, the epitaxially-grown materials 118 may include SiGe, SiGeC, Ge, Si, a boron-doped SiGe, boron and carbon doped SiGe, or a combination thereof. Source/drain region(s) may refer to a source or a drain, individually or collectively dependent upon the context.

The nanostructures 115 (dash lines) extends in the X-direction to connect two epitaxially-grown materials 118. Such the nanostructures 115 and the epitaxially-grown materials 118 connected continuously with each other may be collectively referred to as an active region.

Isolation feature 104 is formed over the substrate 101 and under the gate dielectric layer 111, the gate electrode 112, and the gate spacers 114. The isolation feature 104 is used for isolating the GAA transistor from other devices. In some embodiments, the isolation feature 104 may include different structures, such as shallow trench isolation (STI) structure, deep trench isolation (DTI) structure. Therefore, the isolation feature 104 is also referred as to as a STI feature or DTI feature.

Figure 3A:
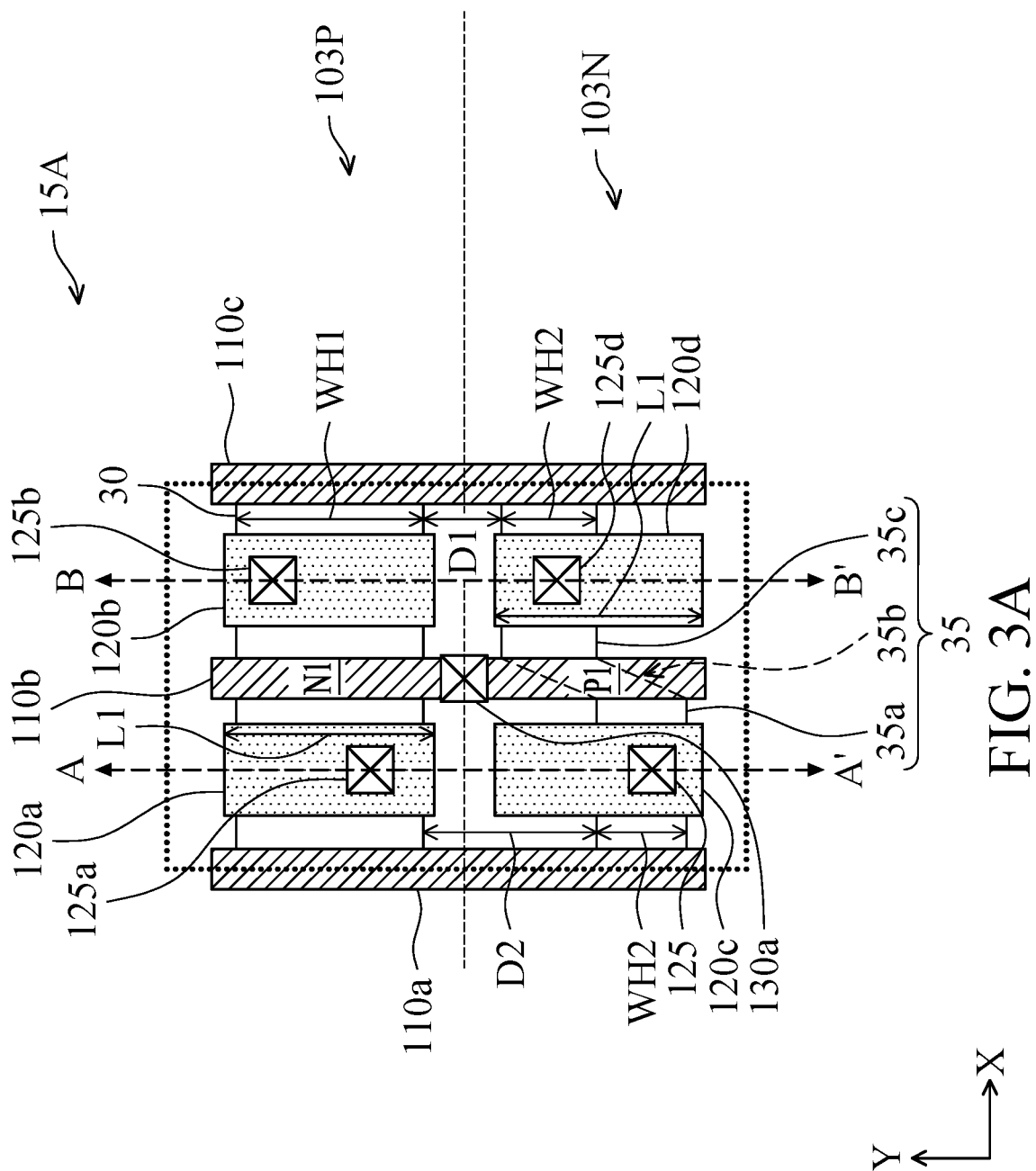
FIGS. 3A and 3B are block diagrams illustrating a layout of features of a logic cell, in accordance with some embodiments of the disclosure.
Figure 3B:
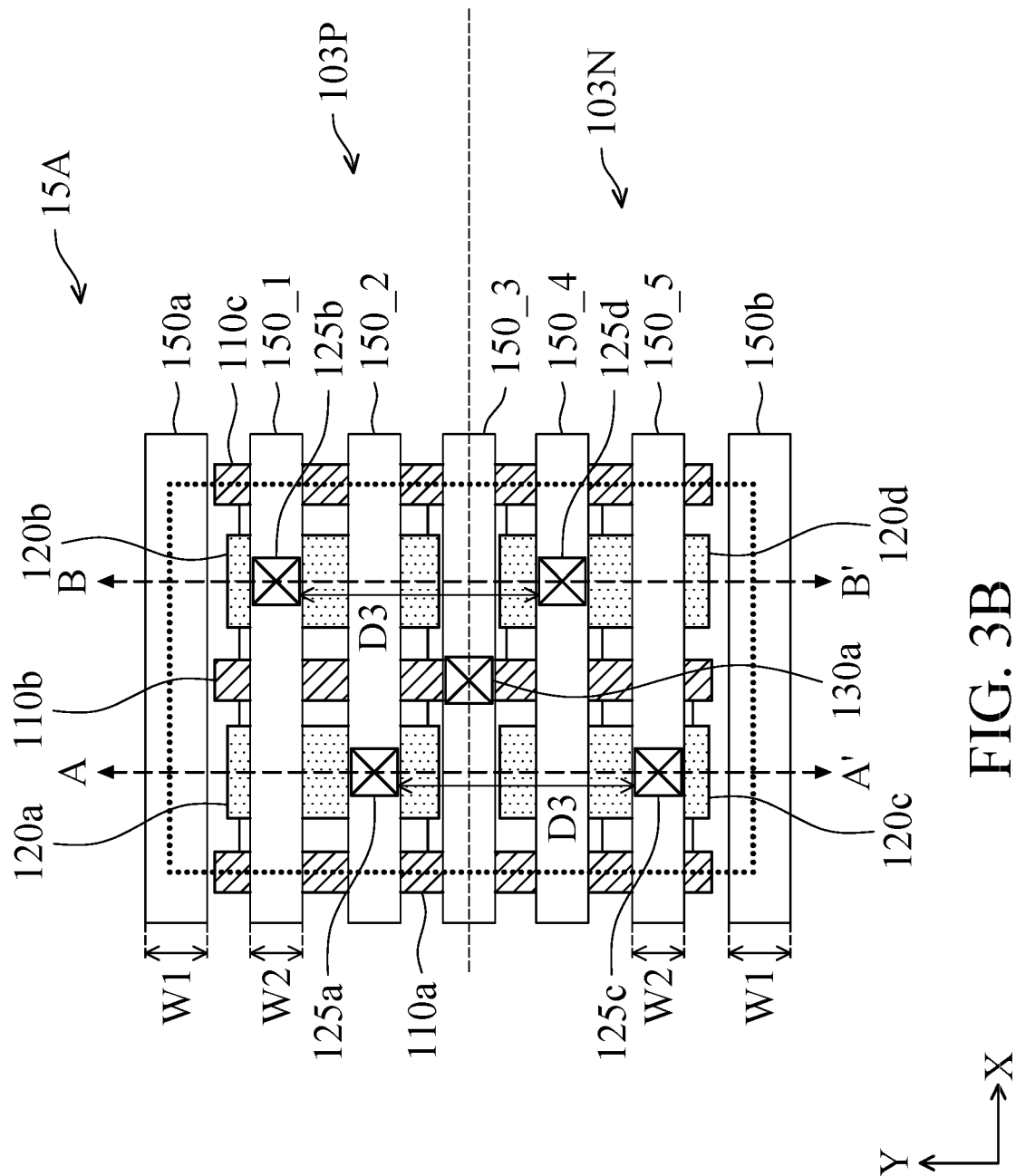

FIGS. 3A and 3B are block diagrams illustrating a layout of features of a logic cell 15A, in accordance with some embodiments of the disclosure. FIGS. 3A and 3B illustrate features in different levels of the logic cell 15A. Furthermore, an outer boundary of the logic cell 15A is illustrated using dashed lines.

FIG. 3A shows features of the logic cell 15A below the lowest metal layer. The logic cell 15A includes the N-type transistor N1 and the P-type transistor P1, and the transistors P1 and N1 are nanostructure transistors. The N-type transistor N1 is formed in an active region 30 of the P-type well region 103P, and the P-type transistor P1 is formed in an active region 35 of the N-type well region 103N.

In the logic cell 15A, the active region 30 has a rectangle shape extending in the X-direction. Furthermore, the active region 30 has a width of WH1 in the Y-direction. In other words, the N-type transistor N1 has the nanostructures 115 with the width WH1. The active region 35 is divided into the active sub-regions 35a, 35b and 35c. The active sub-region 35a has a rectangle shape extending in the X-direction, and has a width of WH2 in the Y-direction, and the width WH2 is less than the width WH1. In some embodiments, the width WH2 is half the width WH1. The active sub-region 35c has a rectangle shape extending in the X-direction, and has the width WH2 in the Y-direction. The active sub-region 35b extends from the active sub-region 35a to the active sub-region 35c, and has the width WH2 in the Y-direction. The P-type transistor P1 has the nanostructures 115 with the width WH2. The distance D2 between the active region 30 and the active sub-region 35a is different from the distance D1 between the active region 30 and the active sub-region 35c in the Y-direction. In the embodiment, the distance D2 is greater than the distance D1. In some embodiments, the distance D1 is determined according to a minimum space for isolating the active regions of different types of transistors.

In the logic cell 15A, the gate structures 110a, 110b and 110c extend in the Y-direction. The P-type transistor P1 and the N-type transistor N1 share the gate structure 110b. The gate structure 110b overlaps the active sub-region 35b and the active region 30. The gate structures 110a and 110c are disposed on the boundary of the logic cell 15A. The gate structures 110a and 110c may be dummy gate structures or floating gate structures. In some embodiments, the gate structures 110a and 110c may be dielectric-base gate structures.

The source/drain contacts 120a and 120b are formed over and in contact with the source/drain features (or source/drain regions) of the N-type transistor N1, and the source/drain contacts 120a and 120b are formed on opposite sides of the gate structure 110b. Each of the source/drain contacts 120a and 120b is a longer contact over the active region 30. The source/drain contacts 120c and 120d are formed over and in contact with the source/drain features (or source/drain regions) of the P-type transistor P1, and the source/drain contacts 120c and 120d are formed on opposite sides of the gate structure 110b. The source/drain contact 120c is a longer contact over the active sub-region 35a, and the source/drain contact 120d is a longer contact over the active sub-region 35c. It should be noted that the source/drain contact 120c does not overlap the active sub-regions 35b and 35c, and the source/drain contact 120d does not overlap the active sub-regions 35a and 35b. Each of the source/drain contacts 120a through 120d has a rectangular shape which has a longer side along the Y-direction and a shorter side along the X-direction. In some embodiments, the source/drain contacts 120a through 120d have the same length L1 in the Y-direction and the same width in the X-direction.

In the logic cell 15A, the gate structure 110b is electrically connected to the upper connection structure through the connecting feature (e.g., the gate via) 130a. The source/drain contacts 120a and 120b are electrically connected to the upper connection structures through the connecting features (e.g., the via) 125a and 125b, respectively. Similarly, the source/drain contacts 120c and 120d are electrically connected to the upper connection structures through the connecting features (e.g., the via) 125c and 125d, respectively.

FIG. 3B shows features of the logic cell 15A in the lowest metal layer and lower. In the embodiment, the metal lines 150a and 150b and the metal lines 150_1 through 1505 are formed in the same metal layer and extend in the X-direction. The number of the metal lines 150_1 through 150_5 that are disposed between the metal lines 150a and 150b are used as an example and are not intended to limit the logic cell 15A. When the cell height of the logic cell 15A is increased, the number of the metal lines disposed between the metal lines 150a and 150b is increased.

The metal line 150a is a VSS line over the P-type well region 103P and is electrically connected to a ground mesh (not shown) through the upper interconnect structure. In some embodiments, the metal line 150a is configured to electrically connect the P-type well region 103P through a pick-up structure (not shown). The metal line 150b is a VDD line over the N-type well region 103N and is electrically connected to a power mesh (not shown) through the upper interconnect structure. In some embodiments, the metal line 150b is configured to electrically connect the N-type well region 103N through a pick-up structure (not shown). The metal lines 150a and 150b are disposed on the boundary of the logic cell 15A.

The metal lines 150_1 through 150_5 are signal lines for the P-type transistor P1 and the N-type transistor N1. The metal line 150_1 is electrically connected to the source/drain contact 120b through the connecting feature (e.g., the via) 125b. The metal line 150_2 is electrically connected to the source/drain contact 120a through the connecting feature 125a. The metal line 150_3 is electrically connected to the gate structure 110b through the connecting feature 130a. The metal line 150_4 is electrically connected to the source/drain contact 120d through the connecting feature 125d. The metal line 150_5 is electrically connected to the source/drain contact 120c through the connecting feature 125c. The distance between the connecting features 125a and 125c is equal to the distance between the connecting features 125b and 125d, i.e., the distance D3.

The metal line 150_3 is disposed over an interface between the P-type well region 103P and the N-type well region 103N. The metal lines 150_1 and 150_2 are disposed between the metal line 150_3 and the metal line 150a, and the metal line 150_2 is disposed between the metal lines 150_1 and 150_3. The metal lines 150_4 and 150_5 are arranged between the metal line 150_3 and the metal line 150b, and the metal line 150_4 is disposed between the metal lines 150_3 and 150_5.

The metal lines 150a and 150b have a line width of W1 in the Y-direction, and the metal lines 150_1 through 1505 have a line width of W2 in the Y-direction. In some embodiments, the power lines are wider than the signal lines, thus the line width W1 is greater than the line width W2. The metal lines 150a and 150b are shared with the logic cells arranged in the same row of the cell array 100. In some embodiments, the metal lines 150_1 through 1505 are shared with the adjacent logic cell in the same row of the cell array 100. In some embodiments, the metal lines 150_1 through 150_5 are not shared with the adjacent logic cell. In the logic cell 15A, the active regions of the transistors P1 and N1 are arranged according to the connecting configuration of metal lines 150_1 through 150_5 of the lowest metal layer.

Figure 4A:
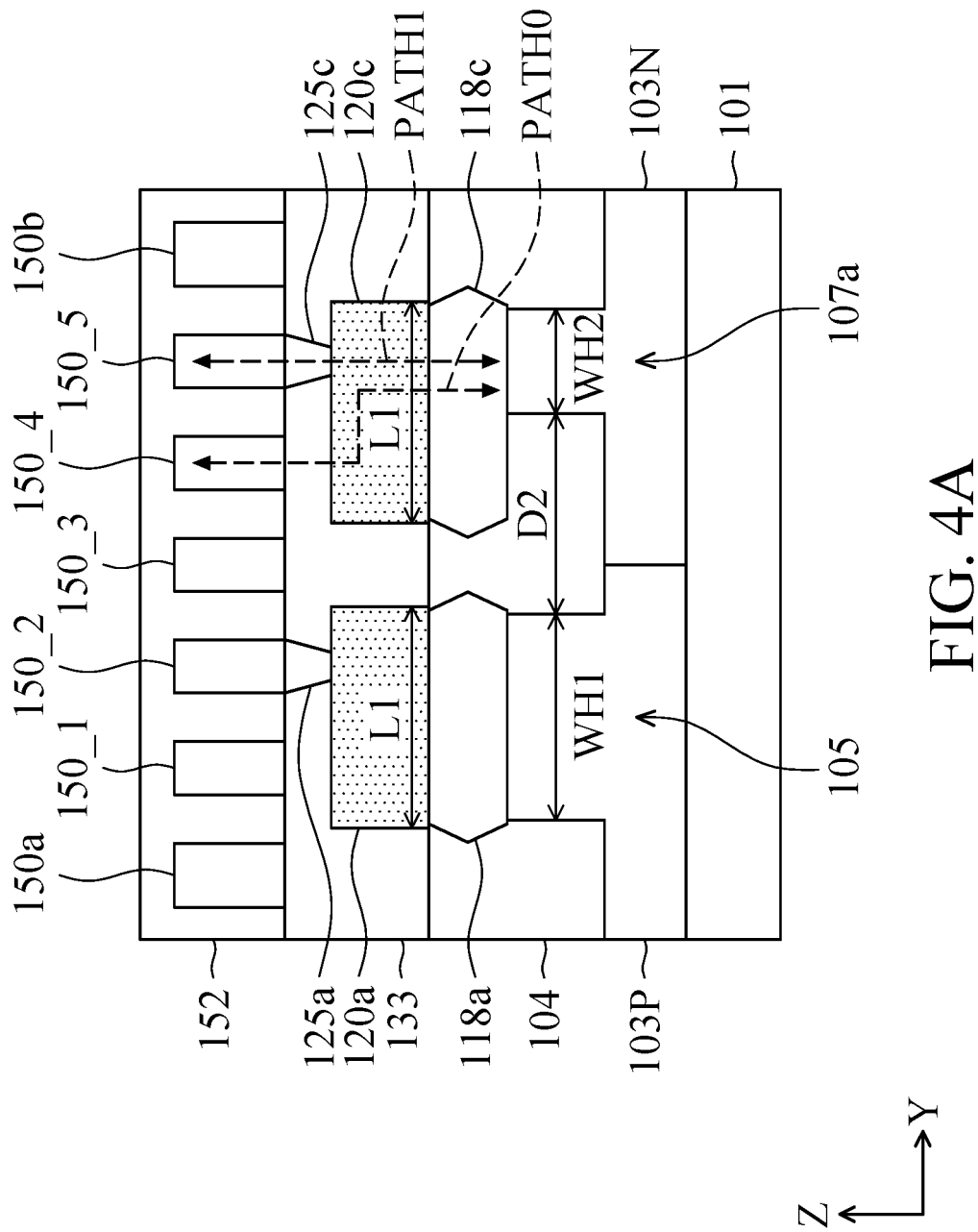
FIG. 4A is a cross sectional view illustrating a semiconductor structure of the logic cell along line A-A' in FIGS. 3A and 3B, in accordance with some embodiments of the disclosure.

FIG. 4A is a cross sectional view illustrating a semiconductor structure of the logic cell 15A along line A-A' in FIGS. 3A and 3B, in accordance with some embodiments of the disclosure. Features in FIG. 4A that are the same or similar to those in the GAA transistor of FIG. 2 are given the same reference numbers, and a detailed description thereof is thus omitted.

The N-type well region 103N and the P-type well region 103P are formed over the substrate 101. A fin base structure 105 corresponding to the active region 30 is formed over the P-type well region 103P, and the fin base structure 105 has the width WH1 in the Y-direction. A fin base structure 107a corresponding to the active sub-region 35a is formed over the N-type well region 103N, and the fin base structure 107a has the width WH2 in the Y-direction. As describe above, the WH1 is greater than the width WH2. Furthermore, the fin base structures 105 and 107a are separated from each other by the isolation feature 104 (e.g., the STI). As described above, the distance between the fin base structures 105 and 107a is D2.

The source/drain feature 118a of the N-type transistor N1 is formed over the fin base structure 105. The source/drain feature 118c of the P-type transistor P1 is formed over the fin base structure 107a. The source/drain feature 118a is formed of epitaxially-grown material, including materials with N-type conductivity, such as SiP, SiC, SiPC, SiAs, Si, or a combination thereof. The source/drain feature 118c is formed of epitaxially-grown material, including materials with P-type conductivity, such as SiGe, SiGeC, Ge, Si, a boron-doped SiGe, boron and carbon doped SiGe, or a combination thereof.

The source/drain contact 120a is formed over and in contact with the source/drain feature 118a, and the source/drain contact 120c is formed over and in contact with the source/drain feature 118c. The source/drain contacts 120a and 120c are separated from each other by the dielectric feature 133. The dielectric feature 133 may be an inter-layer dielectric (ILD). The dielectric feature 133 may include one or more dielectric layers including dielectric materials, such as tetraethyl orthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof. In some embodiments, the length L1 of the contacts 120a is substantially equal to the width WH1 of the fin base structure 105. Furthermore, the length L1 of the contacts 120c is larger than the width WH2 of the fin base structure 107a.

The metal lines 150a and 150b and the metal lines 150_1 through 150_5 are formed in the same level and are separated from each other by the dielectric feature 152. The dielectric feature 152 may be an inter-metal dielectric (IMD). The dielectric feature 152 may include one or more dielectric layers including dielectric materials, such as tetraethyl orthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

In some embodiments, the materials of the source/drain contact, the connecting feature and metal lines in the logic cell 15 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

In FIG. 4A, the connecting feature 125a is formed over the source/drain contact 120a, and overlaps and contacts the metal line 150_2 in the Z-direction. The connecting feature 125c is formed over the source/drain contact 120c, and overlaps and contacts the metal line 150_5 in the Z-direction. The metal line 150_2 and the connecting feature 125a overlap the fin base structure 105 in the Z-direction. Furthermore, the metal line 150_1 also overlaps the fin base structure 105 in the Z-direction. The metal line 150_5 and the connecting feature 125c overlap the fin base structure 107a in the Z-direction. Furthermore, the metal line 150_4 does not overlap the fin base structure 107a in the Z-direction.

In a traditional logic cell, the configured of the active regions are fixed and the smaller active region may be arranged to only overlap one metal line. Thus, the signal path from the adjacent metal line that is adjacent to the one metal line to the device (i.e., the smaller active region) becomes longer because the signal path needs to go through the source/drain contact overlapping both the one metal line and the adjacent metal line and the connecting feature between the source/drain contact and the adjacent metal line, for example, the signal path PATH0. Compared with a traditional logic cell, the signal path PATH1 corresponding to the metal line 150_5 has the shortest path from the lowest metal layer to the device, thereby decreasing the parasitic capacitance between different conductive features and decreasing resistance in the signal path PATH1. In other word, the source/drain feature, the source/drain contact and the connecting feature are directly stacked between the corresponding metal line and the corresponding fin base structure.

Figure 4B:
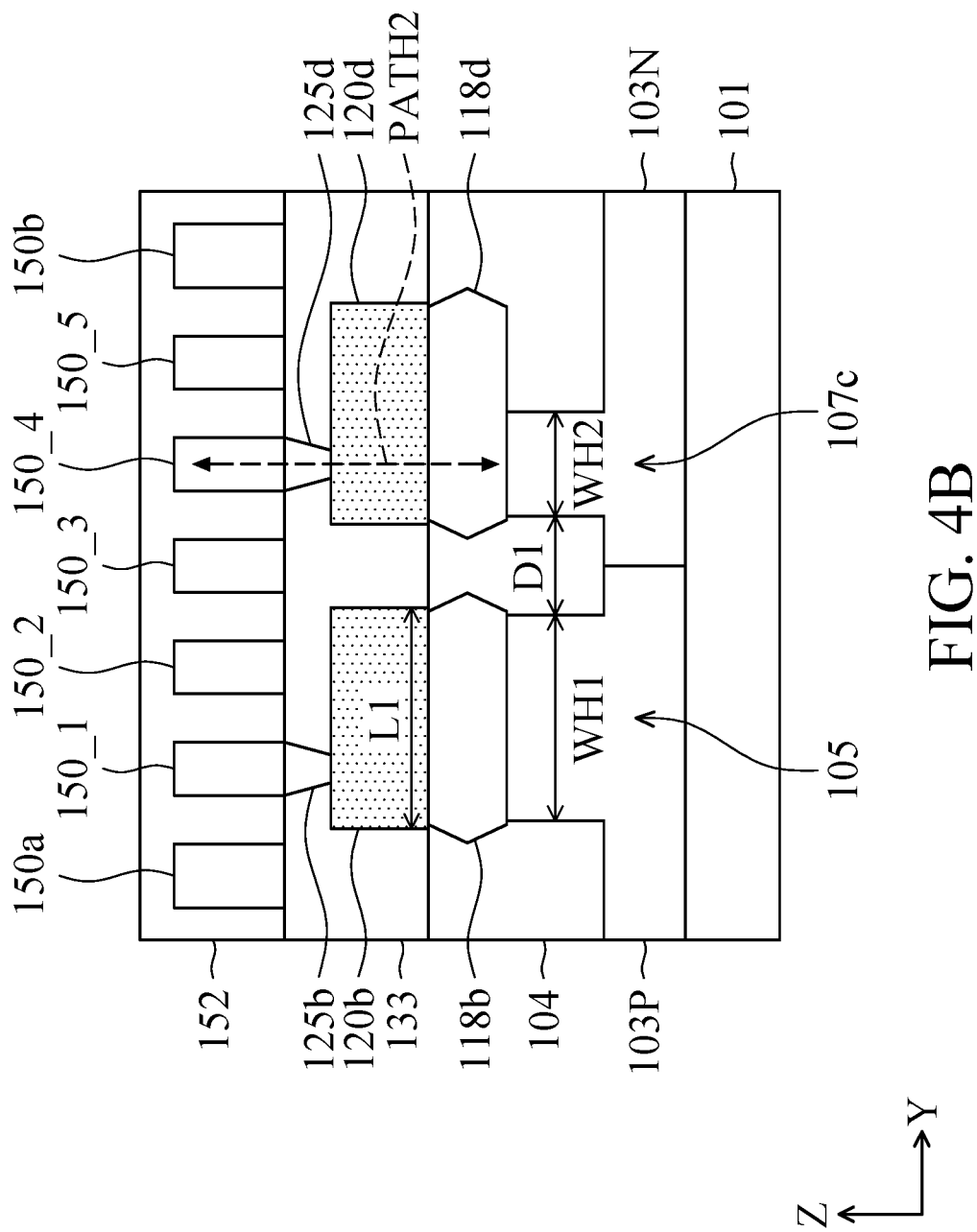
FIG. 4B is a cross sectional view illustrating a semiconductor structure of the logic cell along line B-B' in FIGS. 3A and 3B, in accordance with some embodiments of the disclosure.

FIG. 4B is a cross sectional view illustrating a semiconductor structure of the logic cell 15A along line B-B' in FIGS. 3A and 3B, in accordance with some embodiments of the disclosure. Features in FIG. 4B that are the same or similar to those in the GAA transistor of FIG. 2 are given the same reference numbers, and a detailed description thereof is thus omitted.

The N-type well region 103N and the P-type well region 103P are formed over the substrate 101. The fin base structure 105 corresponding to the active region 30 is formed over the P-type well region 103P. A fin base structure 107c corresponding to the active sub-region 35c is formed over the N-type well region 103N, and the fin base structure 107c has the width WH2 in the Y-direction. As described above, the distance between the base structures 105 and 107c is D1, and the distance D1 is less than the distance D2.

The source/drain feature 118b of the N-type transistor N1 is formed over the fin base structure 105. The source/drain feature 118d of the P-type transistor P1 is formed over the fin base structure 107c. The source/drain feature 118b is formed of epitaxially-grown material, including materials with N-type conductivity. The source/drain feature 118d is formed of epitaxially-grown material, including materials with P-type conductivity.

The source/drain contact 120b is formed over and in contact with the source/drain feature 118b, and the source/drain contact 120d is formed over and in contact with the source/drain feature 118d. The source/drain contacts 120b and 120d are separated from each other by the dielectric feature 133. In some embodiments, the length L1 of the contacts 120b is substantially equal to the width WH1 of the fin base structure 105. Furthermore, the length L1 of the contacts 120d is larger than the width WH2 of the fin base structure 107c.

In FIG. 4B, the connecting feature 125b is formed over the source/drain contact 120b, and overlaps and contacts the metal line 150_1 in the Z-direction. The connecting feature 125d is formed over the source/drain contact 120d, and overlaps and contacts the metal line 150_4 in the Z-direction. The metal line 150_1 and the connecting feature 125b overlap the fin base structure 105 in the Z-direction. Furthermore, the metal line 150_2 also overlaps the fin base structure 105 in the Z-direction. Moreover, the metal line 150_4 and the connecting feature 125d overlap the fin base structure 107c in the Z-direction. Furthermore, the metal line 150_5 does not overlap the fin base structure 107c in the Z-direction. Compared with a traditional logic cell, the signal path PATH2 corresponding to the metal line 150_4 has the shortest path from the lowest metal layer to the device, thereby decreasing the parasitic capacitance between different conductive features and decreasing resistance in the signal path PATH2.

Figure 5A:
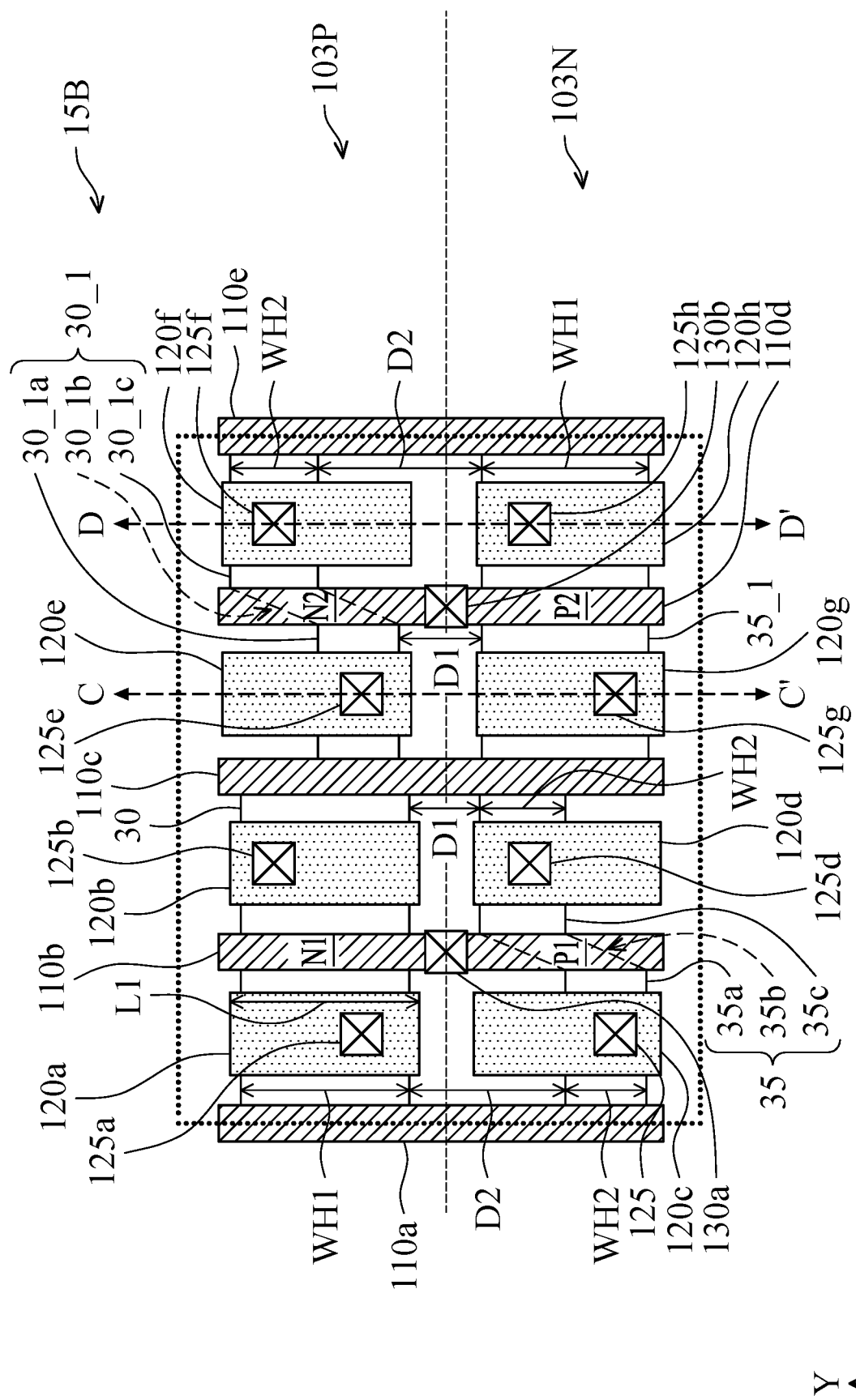
FIGS. 5A and 5B are block diagrams illustrating a layout of features of a logic cell, in accordance with some embodiments of the disclosure.
Figure 5B:
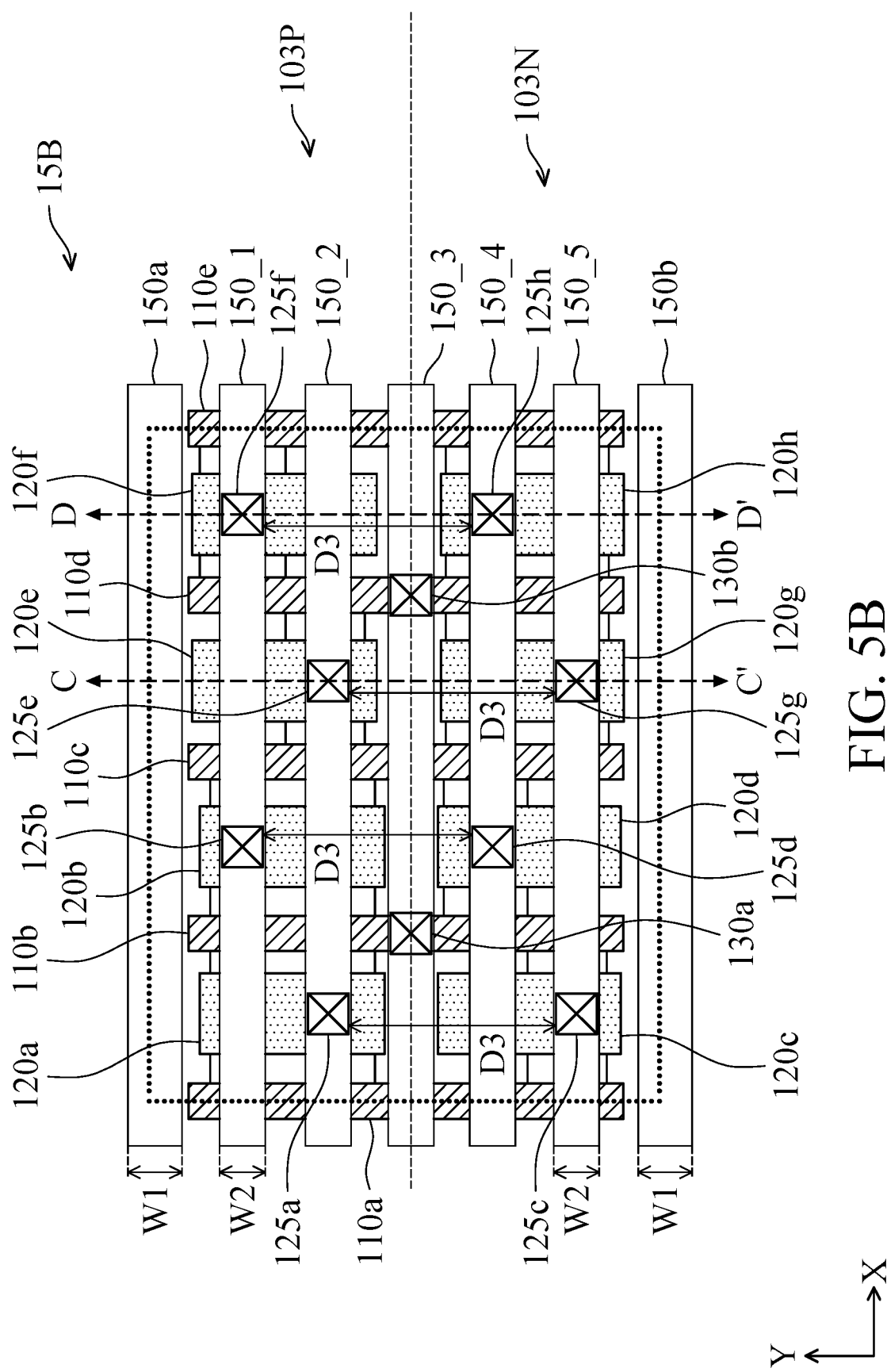

FIGS. 5A and 5B are block diagrams illustrating a layout of features of a logic cell 15B, in accordance with some embodiments of the disclosure. FIGS. 5A and 5B illustrate features in different levels of the logic cell 15B. Furthermore, an outer boundary of the logic cell 15B is illustrated using dashed lines. Compared with the logic cell 15A of FIGS. 3A and 3B, the logic cell 15B further includes the N-type transistor N2 and the P-type transistor P2. The configuration of the N-type transistor N1 and the P-type transistor P1 of the logic cell 15B is the same as that of the logic cell 15A, and will not be repeated in FIGS. 5A and 5B.

FIG. 5A shows features of the logic cell 15B below the lowest metal layer, and FIG. 5B shows features of the logic cell 15B in the lowest metal layer and lower.

The logic cell 15A includes the N-type transistors N1 and N2 and the P-type transistors P1 and P2, and the transistors are nanostructure transistors. The N-type transistors N1 and N2 are formed in the active regions 30 and 30_1 of the P-type well region 103P, respectively. The P-type transistors P1 and P2 are formed in the active regions 35 and 35_1 of the N-type well region 103N, respectively. In some embodiments, the active regions 30 and 30_1 are adjacent together, and the active regions 35 and 35_1 are adjacent together. In some embodiments, the active regions 30 and 30_1 are separated from each other, and the active regions 35 and 35_1 are separated from each other.

In the logic cell 15B, the active region 35_1 has a rectangle shape extending in the X-direction. Furthermore, the active region 35_1 has a width of WH1 in the Y-direction. In other words, the P-type transistor P2 has the nanostructures 115 with the width WH1. The active region 301 is divided into the active sub-regions 30_1a, 30_1b and 30_1c. The active sub-region 30_1a has a rectangle shape extending in the X-direction, and has a width of WH2 in the Y-direction, and the width WH2 is less than the width WH1. In some embodiments, the width WH2 is half the width WH1. The active sub-region 30_1c has a rectangle shape extending in the X-direction, and has the width WH2 in the Y-direction. The active sub-region 30_1b extends from the active sub-region 30_1a to the active sub-region 30_1c, and has the width WH2 in the Y-direction. The N-type transistor N2 has the nanostructures 115 with the width WH2. Moreover, the distance D2 between the active sub-region 30_1c and the active region 35_1 is different from the distance D1 between the active sub-region 30_1a and the active region 35_1 in the Y-direction. In such an embodiment, the distance D2 is greater than the distance D1.

In the logic cell 15B, the gate structures 110a through 110e extend in the Y-direction. The P-type transistor P1 and the N-type transistor N1 share the gate structure 110b, and the gate structure 110b overlaps the active sub-region 35b and the active region 30. The P-type transistor P2 and the N-type transistor N2 share the gate structure 110d, and the gate structure 110d overlaps the active sub-region 30_1b and the active region 35_1. The gate structures 110a and 110e are disposed on the boundary of the logic cell 15B. The N-type transistor N1 is separated from the N-type transistor N2 by the gate structure 110c, and the P-type transistor P1 is separated from the P-type transistor P2 by the gate structure 110c. The gate structures 110a, 110c and 110e may be dummy gate structures or floating gate structures. In some embodiments, the gate structures 110a, 110c and 110e may be dielectric-base gate structures.

The source/drain contacts 120e and 120f are formed over and in contact with the source/drain features (or source/drain regions) of the N-type transistor N2 and are formed on opposite sides of the gate structure 110d. The source/drain contact 120e is a longer contact over the active sub-region 30_1a, and the source/drain contact 120f is a longer contact over the active sub-region 30_1c. It should be noted that the source/drain contact 120e does not overlap the active sub-regions 30_1b and 30_1c, and the source/drain contact 120f does not overlap the active sub-regions 30_1a and 30_1b. The source/drain contacts 120g and 120h are formed over and in contact with the source/drain features (or source/drain regions) of the P-type transistor P2 and are formed on opposite sides of the gate structure 110d. The source/drain contacts 120g and 120h are a longer contact over the active region 35_1. Each of the source/drain contacts 120a through 120h has a rectangular shape which has a longer side along the Y-direction and a shorter side along the X-direction. In some embodiments, the source/drain contacts 120a through 120h have the same length L1 in the Y-direction and the same width in the X-direction.

In the logic cell 15B, the gate structures 110b and 110d are electrically connected to the metal line 1503 through the connecting features (e.g., the gate via) 130a and 130b, respectively. The metal lines 150_1 through 150_5 are signal lines for the P-type transistors P1 and P2 and the N-type transistors N1 and N2. The source/drain contacts 120a and 120e are electrically connected to the metal line 150_2 through the connecting features (e.g., the via) 125a and 125e, respectively. The source/drain contacts 120b and 120f are electrically connected to the metal line 150_1 through the connecting features (e.g., the via) 125b and 125f, respectively. The source/drain contacts 120c and 120g are electrically connected to the metal line 150_5 through the connecting features (e.g., the via) 125c and 125g, respectively. The source/drain contacts 120d and 120h are electrically connected to the metal line 150_4 through the connecting features (e.g., the via) 125d and 125h, respectively. In the logic cell 15B, the active regions of the P-type transistors P1 and P2 and the active regions of the N-type transistors N1 and N2 are arranged according to the connecting configuration of metal lines 150_1 through 1505 of the lowest metal layer.

Figure 6A:
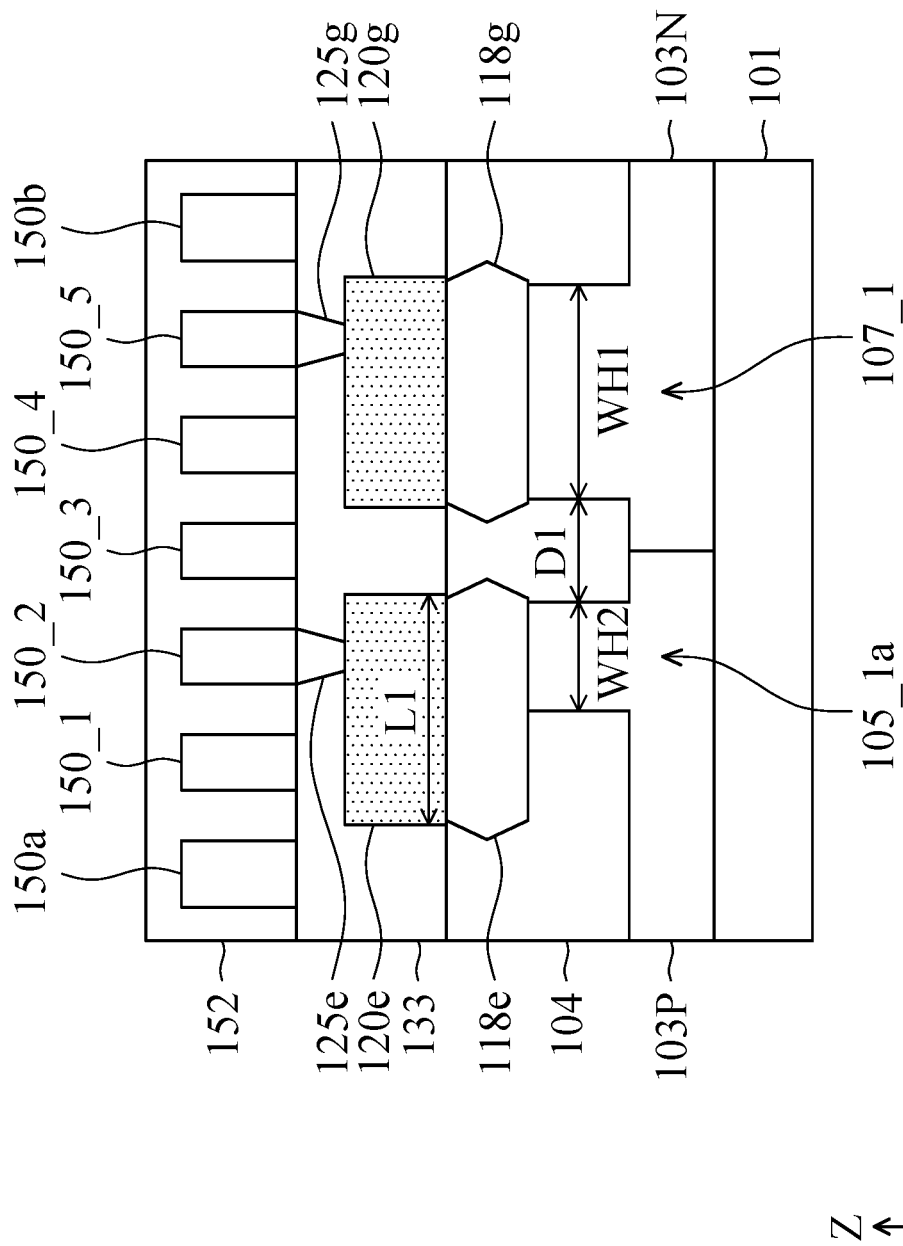
FIG. 6A is a cross sectional view illustrating a semiconductor structure of the logic cell along line C-C' in FIGS. 5A and 5B, in accordance with some embodiments of the disclosure.

FIG. 6A is a cross sectional view illustrating a semiconductor structure of the logic cell 15B along line C-C' in FIGS. 5A and 5B, in accordance with some embodiments of the disclosure. Features in FIG. 6A that are the same or similar to those in the GAA transistor of FIG. 2 are given the same reference numbers, and a detailed description thereof is thus omitted.

The N-type well region 103N and the P-type well region 103P are formed over the substrate 101. A fin base structure 105_1a corresponding to the active sub-region 30_1a is formed over the P-type well region 103P, and the fin base structure 105_1a has the width WH2 in the Y-direction. A fin base structure 107_1 corresponding to the active region 35_1 is formed over the N-type well region 103N, and the fin base structure 107_1 has the width WH1 in the Y-direction. As describe above, the WH1 of the active region 35_1 is greater than the width WH2 of the active sub-region 30_1a. Furthermore, the distance between the fin base structures 105_1 and 107_1 is D1.

The source/drain feature 118e of the N-type transistor N2 is formed over the fin base structure 105_1a. The source/drain feature 118g of the P-type transistor P2 is formed over the fin base structure 107_1. The source/drain feature 118e is formed of epitaxially-grown material, including materials with N-type conductivity. The source/drain feature 118g is formed of epitaxially-grown material, including materials with P-type conductivity.

The source/drain contact 120e is formed over and in contact with the source/drain feature 118e, and the source/drain contact 120g is formed over and in contact with the source/drain feature 118g. In some embodiments, the length L1 of the contact 120g is substantially equal to the width WH1 of the fin base structure 107_1. Furthermore, the length L1 of the contacts 120e is larger than the width WH2 of the fin base structure 105_1a.

In FIG. 6A, the connecting feature 125e is formed over the source/drain contact 120e, and overlaps and contacts the metal line 150_2 in the Z-direction. The connecting feature 125g is formed over the source/drain contact 120g, and overlaps and contacts the metal line 150_5 in the Z-direction. The metal line 150_2 and the connecting feature 125e overlap the fin base structure 105_1a in the Z-direction. Furthermore, the metal line 150_1 does not overlap the fin base structure 105_1a in the Z-direction. The metal line 150_5 and the connecting feature 125g overlap the fin base structure 107_1 in the Z-direction. Furthermore, the metal line 150_4 also overlaps the fin base structure 107_1 in the Z-direction. Compared with a traditional logic cell, the signal path corresponding to the metal line 150_2 has the shortest path from the lowest metal layer to the device, thereby decreasing the parasitic capacitance between different conductive features and decreasing resistance in the signal path.

Figure 6B:
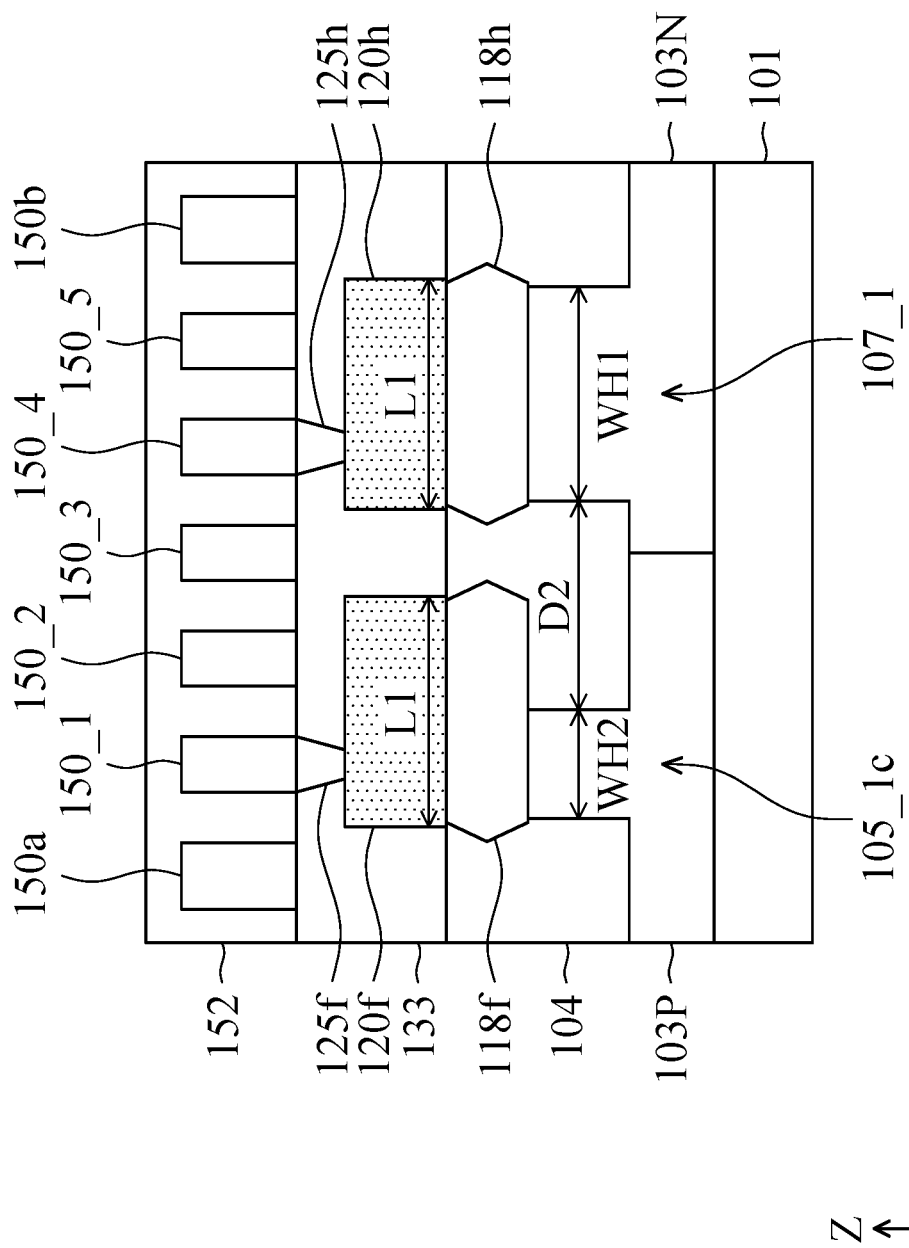
FIG. 6B is a cross sectional view illustrating a semiconductor structure of the logic cell along line D-D' in FIGS. 5A and 5B, in accordance with some embodiments of the disclosure.

FIG. 6B is a cross sectional view illustrating a semiconductor structure of the logic cell 15B along line D-D' in FIGS. 5A and 5B, in accordance with some embodiments of the disclosure. Features in FIG. 6B that are the same or similar to those in the GAA transistor of FIG. 2 are given the same reference numbers, and a detailed description thereof is thus omitted.

The fin base structure 105_1c corresponding to the active sub-region 30_1c is formed over the P-type well region 103P, and the fin base structure 105_1c has the width WH2 in the Y-direction. The fin base structure 107_1 corresponding to the active region 35_1 is formed over the N-type well region 103N, and the fin base structure 107_1 has the width WH1 in the Y-direction. The distance between the base structures 105_1a and 107_1 is D2.

The source/drain feature 118f of the N-type transistor N2 is formed over the fin base structure 105_1c. The source/drain feature 118h of the P-type transistor P2 is formed over the fin base structure 107_1. The source/drain feature 118f is formed of epitaxially-grown material, including materials with N-type conductivity, and the source/drain feature 118h is formed of epitaxially-grown material, including materials with P-type conductivity.

The source/drain contact 120f is formed over and in contact with the source/drain feature 118f, and the source/drain contact 120h is formed over and in contact with the source/drain feature 118h. In some embodiments, the length L1 of the contacts 120h is substantially equal to the width WH1 of the fin base structure 107_1. Furthermore, the length L1 of the contacts 120f is greater than the width WH2 of the fin base structure 105_1c.

In FIG. 6B, the connecting feature 125f is formed over the source/drain contact 120f, and overlaps and contacts the metal line 150_1 in the Z-direction. The connecting feature 125h is formed over the source/drain contact 120h, and overlaps and contacts the metal line 150_4 in the Z-direction. The metal line 150_1 and the connecting feature 125f overlap the fin base structure 105_1c in the Z-direction. Furthermore, the metal line 150_2 does not overlap the fin base structure 105_1c in the Z-direction. The metal line 150_4 and the connecting feature 125h overlap the fin base structure 107_1 in the Z-direction. Furthermore, the metal line 150_5 also overlaps the fin base structure 107_1 in the Z-direction. Compared with a traditional logic cell, the signal path corresponding to the metal line 150_1 has the shortest path from the lowest metal layer to the device, thereby decreasing the parasitic capacitance between different conductive features and decreasing resistance in the signal path.

Figure 7A:
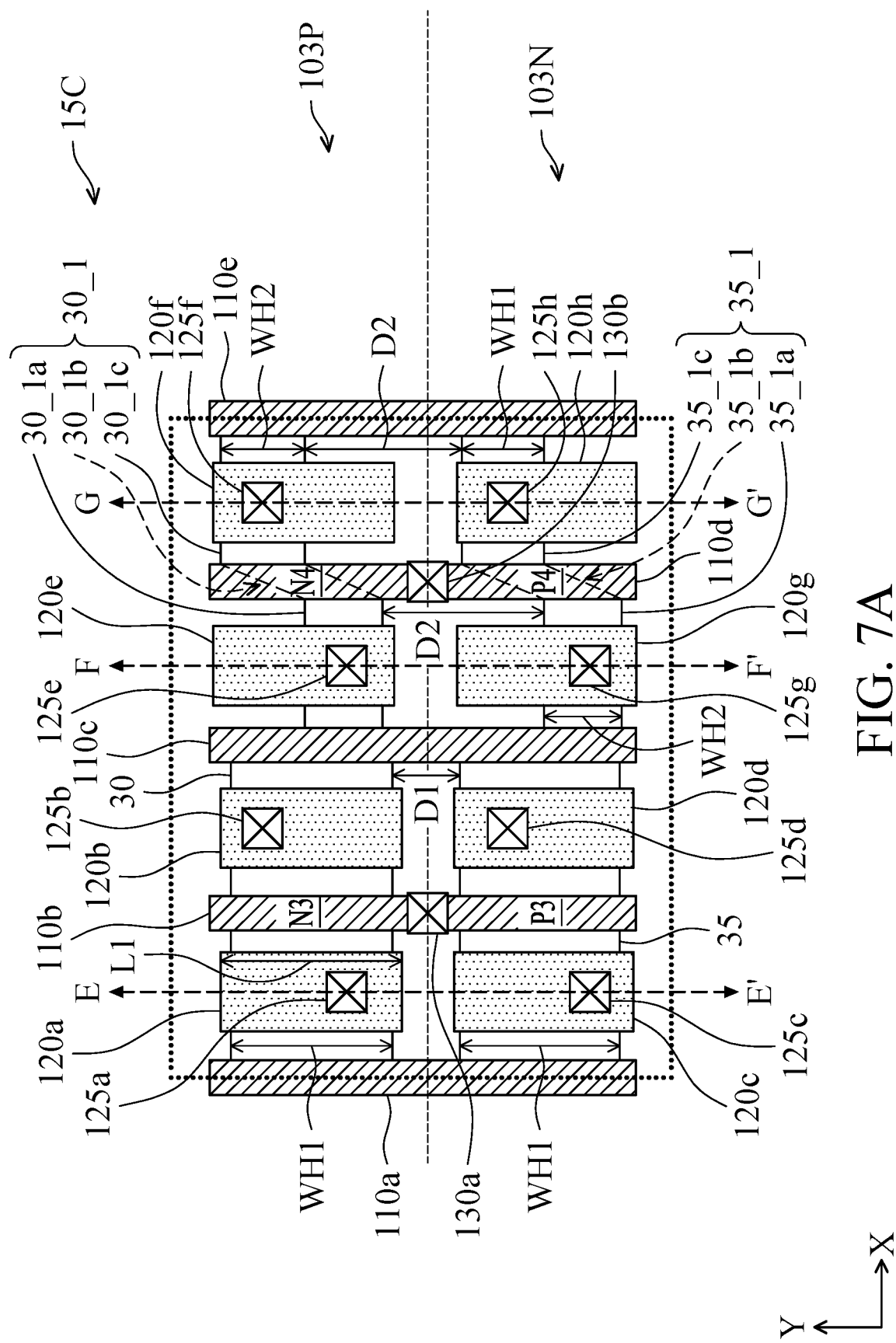
FIGS. 7A and 7B are block diagrams illustrating a layout of features of a logic cell, in accordance with some embodiments of the disclosure.
Figure 7B:
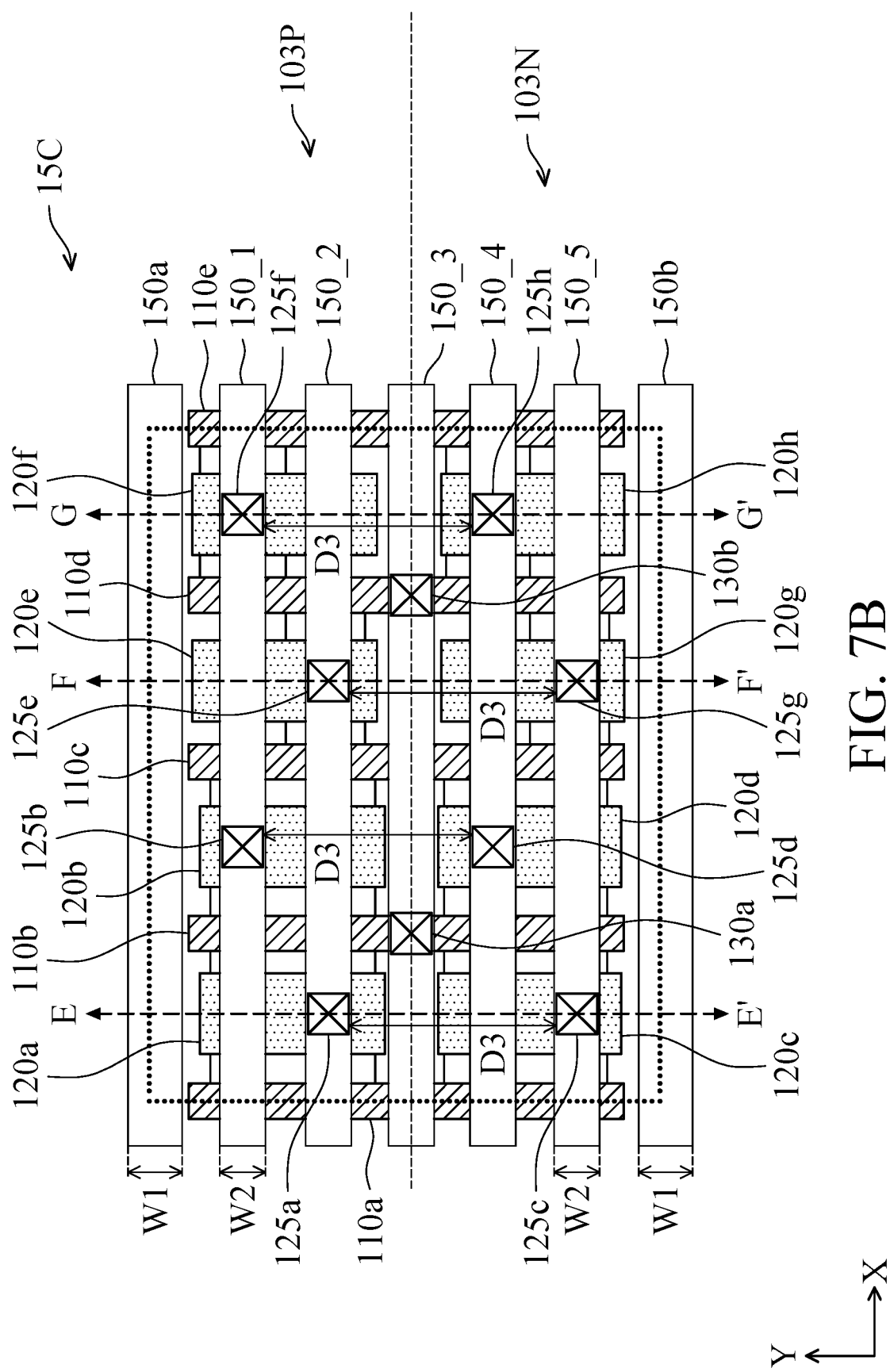

FIGS. 7A and 7B are block diagrams illustrating a layout of features of a logic cell 15C, in accordance with some embodiments of the disclosure. FIGS. 7A and 7B illustrate features in different levels of the logic cell 15C. Furthermore, an outer boundary of the logic cell 15C is illustrated using dashed lines. The logic cell 15C includes the N-type transistors N3 and N4 and the P-type transistors P3 and P4, and the transistors are nanostructure transistors.

FIG. 7A shows features of the logic cell 15C below the lowest metal layer, and FIG. 7B shows features of the logic cell 15C in the lowest metal layer and lower. The N-type transistors N3 and N4 are formed in the active regions 30 and 30_1 of the P-type well region 103P, respectively. The P-type transistors P3 and P4 are formed in the active regions 35 and 35_1 of the N-type well region 103N, respectively. In some embodiments, the active regions 30 and 30_1 are adjacent together, and the active regions 35 and 35_1 are adjacent together. In some embodiments, the active regions 30 and 30_1 are separated from each other, and the active regions 35 and 35_1 are separated from each other.

In the logic cell 15C, the active regions 30 and 35 have a rectangle shape extending in the X-direction. Furthermore, the active regions 30 and 35 have a width of WH1 in the Y-direction. In other words, the P-type transistor P3 and the N-type transistor N3 have nanostructures 115 with a width of WH1. In some embodiments, the distance between the active regions 30 and 35 is D1.

The active region 301 is divided into the active sub-regions 30_1a, 30_1b and 30_1c, and the active region 35_1 is divided into the active sub-regions 35_1a, 35_1b and 35_1c. Each of the active sub-regions 30_1a, 30_1c, 35_1a and 35_1c has a rectangle shape extending in the X-direction, and has a width of WH2 in the Y-direction. The active sub-region 30_1b extends from the active sub-region 30_1a to the active sub-region 30_1c, and has the width WH2 in the Y-direction. Similarly, the active sub-region 35_1b extends from the active sub-region 35_1a to the active sub-region 35_1c, and has the width WH2 in the Y-direction. The N-type transistor N4 and the P-type transistor P4 have nanostructures 115 with a width of WH2. Moreover, the distance between the active sub-region 30_1c and the active sub-region 35_1c and the distance between the active sub-region 30_1a and the active sub-region 35_1a are equal to D2 in the Y-direction.

In the logic cell 15C, the gate structures 110a through 110e extend in the Y-direction. The P-type transistor P3 and the N-type transistor N3 share the gate structure 110b, and the gate structure 110b overlaps the active regions 35 and 30. The P-type transistor P4 and the N-type transistor N4 share the gate structure 110d, and the gate structure 110d overlaps the active sub-regions 30_1b and 35_1b. The gate structures 110a and 110e are disposed on the boundary of the logic cell 15C. The gate structures 110a, 110c and 110e may be dummy gate structures or floating gate structures. In some embodiments, the gate structures 110a, 110c and 110e may be dielectric-base gate structures.

The source/drain contacts 120a and 120b are formed over and in contact with the source/drain features (or source/drain regions) of the N-type transistor N3, and the source/drain contacts 120e and 120f are formed over and in contact with the source/drain features (or source/drain regions) of the N-type transistor N4. The source/drain contacts 120c and 120d are formed over and in contact with the source/drain features (or source/drain regions) of the P-type transistor P3, and the source/drain contacts 120g and 120h are formed over and in contact with the source/drain features (or source/drain regions) of the P-type transistor P4.

In the logic cell 15C, the gate structures 110b and 110d are electrically connected to the metal line 1503 through the connecting features (e.g., the gate via) 130a and 130b, respectively. The metal lines 150_1 through 150_5 are signal lines for the P-type transistors P3 and P4 and the N-type transistors N3 and N4. The source/drain contacts 120a and 120e are electrically connected to the metal line 150_2 through the connecting features 125a and 125e, respectively. The source/drain contacts 120b and 120f are electrically connected to the metal line 150_1 through the connecting features 125b and 125f, respectively. The source/drain contacts 120c and 120g are electrically connected to the metal line 1505 through the connecting features 125c and 125g, respectively. The source/drain contacts 120d and 120h are electrically connected to the metal line 150_4 through the connecting features 125d and 125h, respectively. In the logic cell 15C, the active regions of the P-type transistors P31 and P4 and the active regions of the N-type transistors N3 and N4 are arranged according to the connecting configuration of metal lines 150_1 through 1505 of the lowest metal layer.

Figure 8A:
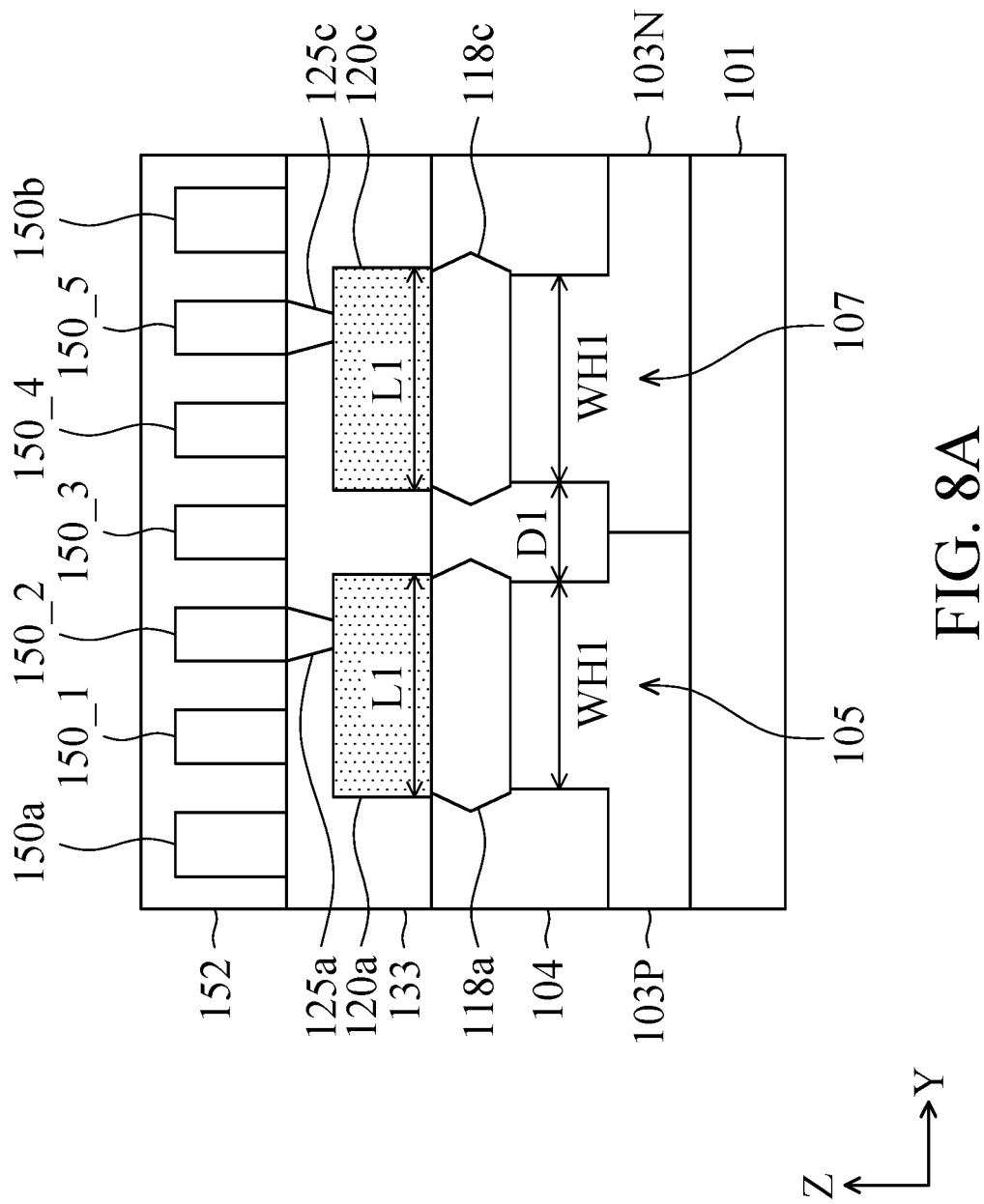
FIG. 8A is a cross sectional view illustrating a semiconductor structure of the logic cell along line E-E' in FIGS. 7A and 7B, in accordance with some embodiments of the disclosure.

FIG. 8A is a cross sectional view illustrating a semiconductor structure of the logic cell 15C along line E-E' in FIGS. 7A and 7B, in accordance with some embodiments of the disclosure. Features in FIG. 8A that are the same or similar to those in the GAA transistor of FIG. 2 are given the same reference numbers, and a detailed description thereof is thus omitted.

The fin base structure 105 corresponding to the active region 30 is formed over the P-type well region 103P, and the fin base structure 107 corresponding to the active region 35 is formed over the N-type well region 103N. The fin base structure 105 and 107 have a width of WH1 in the Y-direction. Furthermore, the distance between the fin base structures 105 and 107 is D1.

The source/drain feature 118a of the N-type transistor N3 is formed over the fin base structure 105. The source/drain feature 118c of the P-type transistor P3 is formed over the fin base structure 107. The source/drain contact 120a is formed over and in contact with the source/drain feature 118a, and the source/drain contact 120c is formed over and in contact with the source/drain feature 118c. In some embodiments, the length L1 of the contact 120a and 120c are substantially equal to the width WH1 of the fin base structures 105 and 107.

In FIG. 8A, the connecting feature 125a is formed over the source/drain contact 120a, and overlaps and contacts the metal line 150_2 in the Z-direction. The connecting feature 125c is formed over the source/drain contact 120c, and overlaps and contacts the metal line 150_5 in the Z-direction.

Figure 8B:
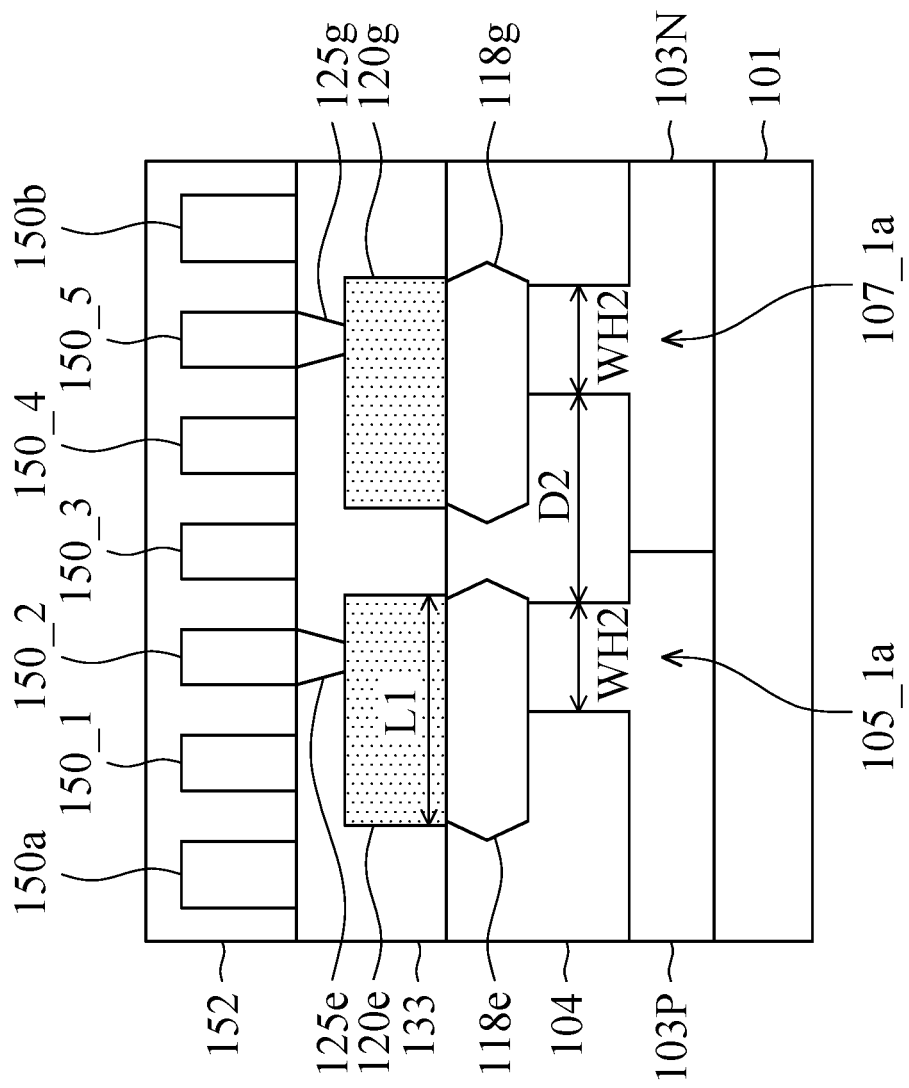
FIG. 8B is a cross sectional view illustrating a semiconductor structure of the logic cell along line F-F' in FIGS. 7A and 7B, in accordance with some embodiments of the disclosure.

FIG. 8B is a cross sectional view illustrating a semiconductor structure of the logic cell 15C along line F-F' in FIGS. 7A and 7B, in accordance with some embodiments of the disclosure. Features in FIG. 8B that are the same or similar to those in the GAA transistor of FIG. 2 are given the same reference numbers, and a detailed description thereof is thus omitted.

The fin base structure 105_1a corresponding to the active region 30_1a is formed over the P-type well region 103P, and the fin base structure 107_1a corresponding to the active region 35_1a is formed over the N-type well region 103N. The fin base structure 105_1a and 107_1a have a width of WH2 in the Y-direction. Furthermore, the distance between the fin base structures 105 and 107 is D2.

The source/drain feature 118e of the N-type transistor N4 is formed over the fin base structure 105_1a. The source/drain feature 118g of the P-type transistor P4 is formed over the fin base structure 107_1a. The source/drain contact 120e is formed over and in contact with the source/drain feature 118e, and the source/drain contact 120g is formed over and in contact with the source/drain feature 118g. Moreover, the length L1 of the contact 120e and 120g are greater than the width WH2 of the fin base structures 105_1a and 107_1a.

In FIG. 8B, the connecting feature 125e is formed over the source/drain contact 120e, and overlaps and contacts the metal line 150_2 in the Z-direction. The connecting feature 125g is formed over the source/drain contact 120g, and overlaps and contacts the metal line 150_5 in the Z-direction. The metal line 150_2 and the connecting feature 125e overlap the fin base structure 105_1a in the Z-direction. Furthermore, the metal line 150_1 does not overlap the fin base structure 105_1a in the Z-direction. The metal line 150_5 and the connecting feature 125g overlap the fin base structure 107_1a in the Z-direction. Furthermore, the metal line 150_4 does not overlap the fin base structure 107_1a in the Z-direction. Compared with a traditional logic cell, the signal path corresponding to the metal line 150_2 and the signal path corresponding to the metal line 150_5 have the shortest path from the lowest metal layer to the device because the active regions of the transistors N4 and P4 are disposed directly under the corresponding metal lines, thereby decreasing the parasitic capacitance between different conductive features and decreasing resistance in the signal path.

Figure 8C:
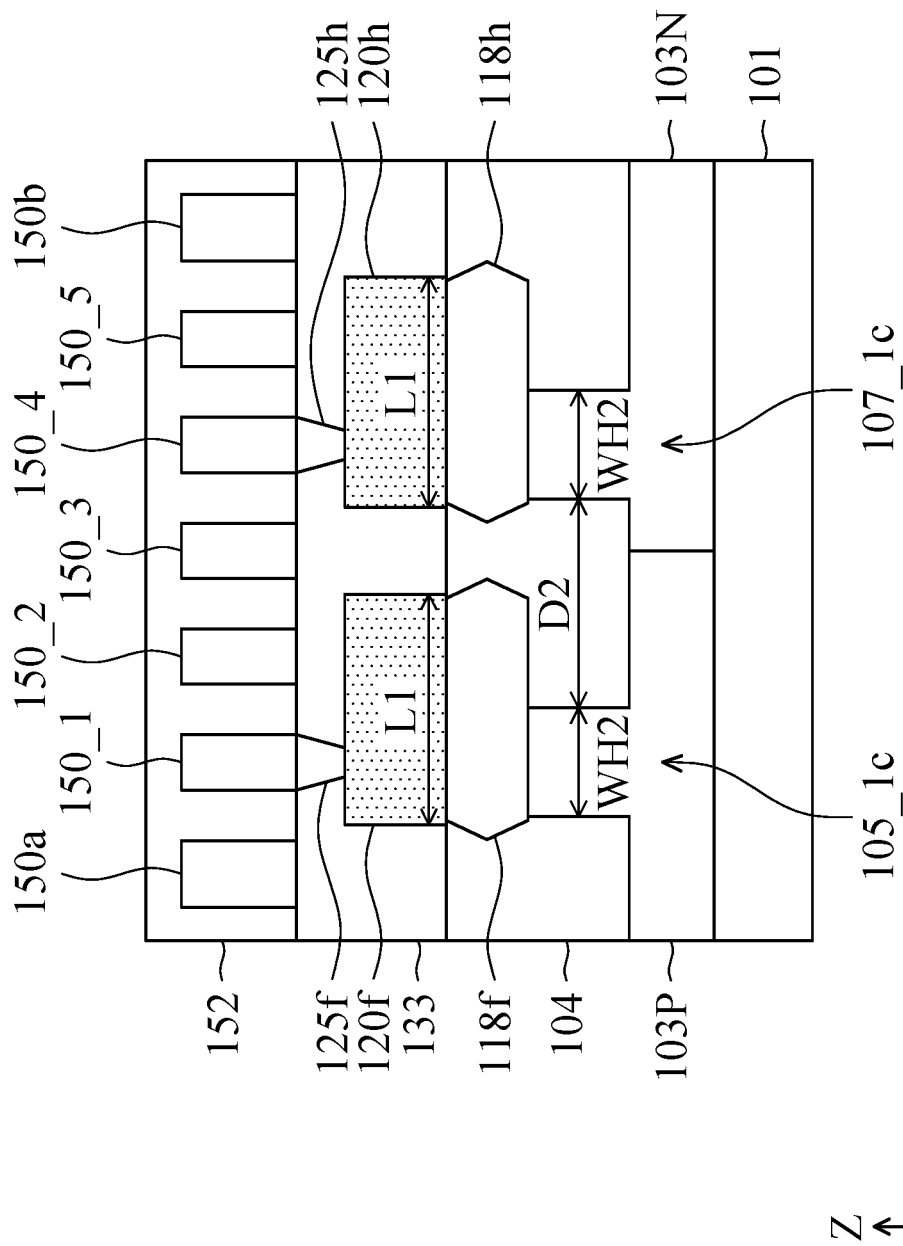
FIG. 8C is a cross sectional view illustrating a semiconductor structure of the logic cell along line G-G' in FIGS. 7A and 7B, in accordance with some embodiments of the disclosure.

FIG. 8C is a cross sectional view illustrating a semiconductor structure of the logic cell 15C along line G-G' in FIGS. 7A and 7B, in accordance with some embodiments of the disclosure. Features in FIG. 8C that are the same or similar to those in the GAA transistor of FIG. 2 are given the same reference numbers, and a detailed description thereof is thus omitted.

The fin base structure 105_1c corresponding to the active region 30_1c is formed over the P-type well region 103P, and the fin base structure 107_1c corresponding to the active region 35_1c is formed over the N-type well region 103N. The fin base structure 105_1c and 107_1c have a width of WH2 in the Y-direction. Furthermore, the distance between the fin base structures 105 and 107 is D2.

The source/drain feature 118f of the N-type transistor N4 is formed over the fin base structure 105_1c. The source/drain feature 118h of the P-type transistor P4 is formed over the fin base structure 107_1c. The source/drain contact 120f is formed over and in contact with the source/drain feature 118f, and the source/drain contact 120h is formed over and in contact with the source/drain feature 118h. Moreover, the length L1 of the contact 120f and 120h are greater than the width WH2 of the fin base structures 105_1c and 107_1c.

In FIG. 8C, the connecting feature 125f is formed over the source/drain contact 120f, and overlaps and contacts the metal line 150_1 in the Z-direction. The connecting feature 125h is formed over the source/drain contact 120h, and overlaps and contacts the metal line 150_4 in the Z-direction. The metal line 150_1 and the connecting feature 125f overlap the fin base structure 105_1c in the Z-direction. Furthermore, the metal line 150_2 does not overlap the fin base structure 105_1c in the Z-direction. The metal line 150_4 and the connecting feature 125h overlap the fin base structure 107_1c in the Z-direction. Furthermore, the metal line 150_5 does not overlap the fin base structure 107_1c in the Z-direction. Compared with a traditional logic cell, the signal path corresponding to the metal line 150_1 and the signal path corresponding to the metal line 150_4 have the shortest path from the lowest metal layer to the device, thereby decreasing the parasitic capacitance between different conductive features and decreasing resistance in the signal path.

Figure 9A:
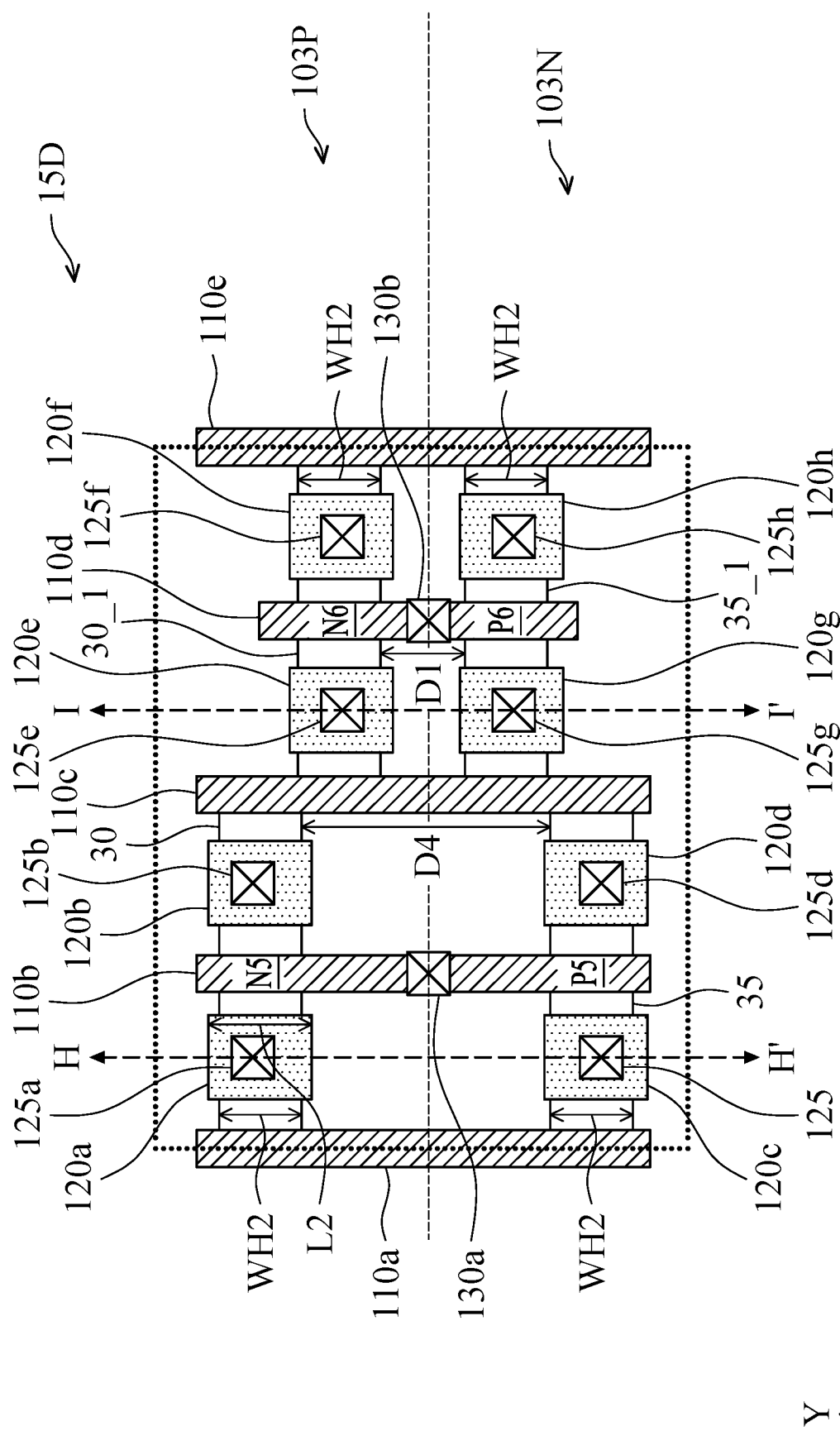
FIGS. 9A and 9B are block diagrams illustrating a layout of features of a logic cell, in accordance with some embodiments of the disclosure.
Figure 9B:
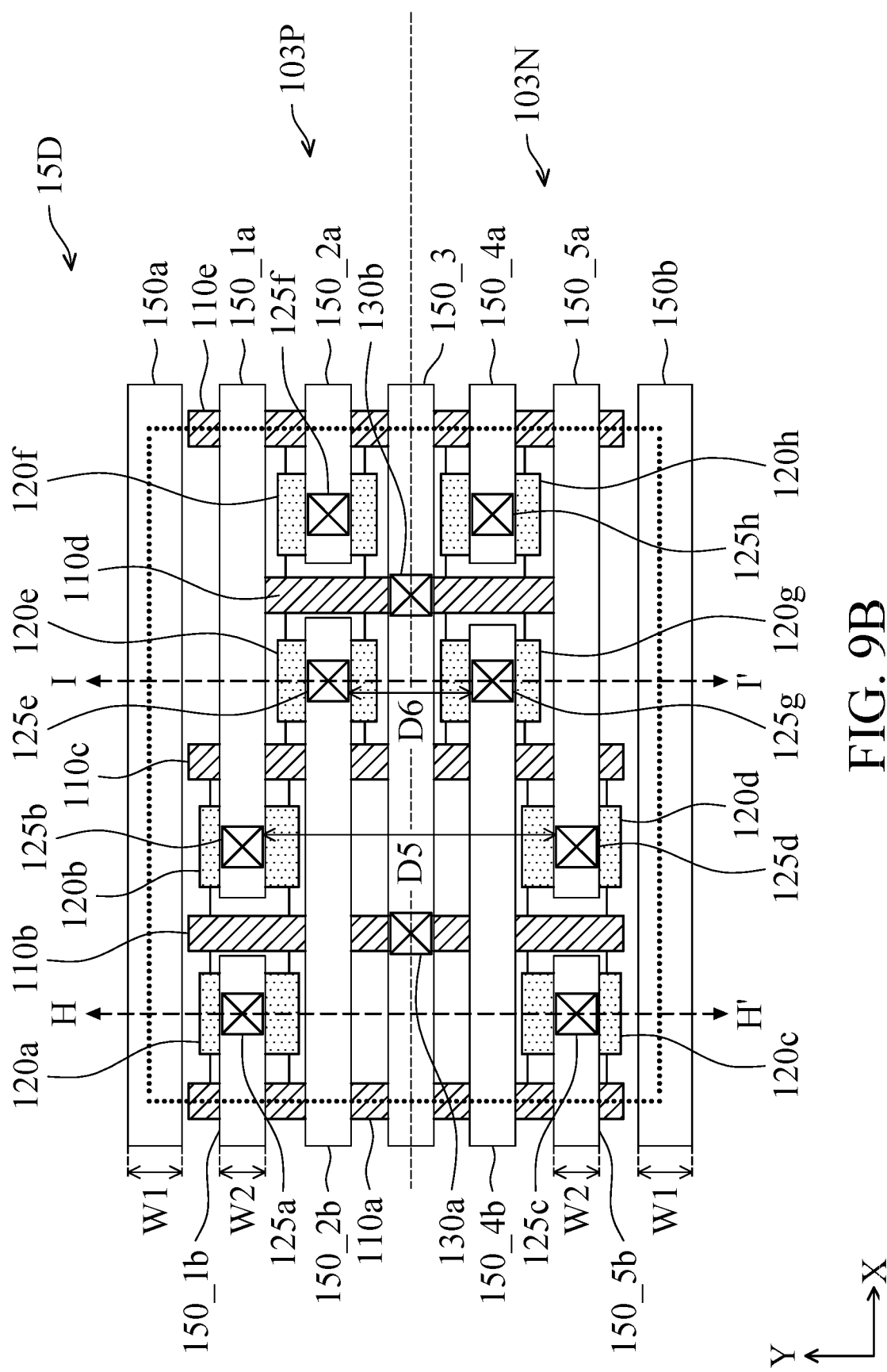

FIGS. 9A and 9B are block diagrams illustrating a layout of features of a logic cell 15D, in accordance with some embodiments of the disclosure. FIGS. 9A and 9B illustrate features in different levels of the logic cell 15D. Furthermore, an outer boundary of the logic cell 15D is illustrated using dashed lines. The logic cell 15D includes the N-type transistors N5 and N6 and the P-type transistors P5 and P6, and the transistors are nanostructure transistors.

FIG. 9A shows features of the logic cell 15D below the lowest metal layer, and FIG. 9B shows features of the logic cell 15D in the lowest metal layer and lower.

The N-type transistors N5 and N6 are formed in the active regions 30 and 30_1 of the P-type well region 103P, respectively. The P-type transistors P5 and P6 are formed in the active regions 35 and 35_1 of the N-type well region 103N, respectively. In some embodiments, the active regions 30 and 30_1 are adjacent together, and the active regions 35 and 35_1 are adjacent together. In some embodiments, the active regions 30 and 30_1 are separated from each other, and the active regions 35 and 35_1 are separated from each other.

In the logic cell 15D, the active regions 30 and 30_1 and the active regions 35 and 35_1 have a rectangle shape extending in the X-direction. Furthermore, the active regions 30 and 30_1 and the active regions 35 and 35_1 have a width of WH2 in the Y-direction. In other words, the P-type transistors P5 and P6 and the N-type transistors N5 and N6 have nanostructures 115 with a width of WH2. In such embodiments, the distance between the active regions 30 and 35 is D4, and D4 is greater than D2. Moreover, the distance between the active regions 30_1 and 35_1 is D1.

In the logic cell 15D, the gate structures 110a through 110e extend in the Y-direction. The P-type transistor P5 and the N-type transistor N5 share the gate structure 110b, and the gate structure 110b overlaps the active regions 35 and 30.

The P-type transistor P6 and the N-type transistor N6 share the gate structure 110d, and the gate structure 110d overlaps the active regions 30_1 and 35_1. The gate structures 110a and 110e are disposed on the boundary of the logic cell 15D. The gate structures 110a, 110c and 110e may be dummy gate structures or floating gate structures. In some embodiments, the gate structures 110a, 110c and 110e may be dielectric-base gate structures. It should be noted that the length of the gate structure 110d is shorter than that of the gate structures 110a, 110b, 110c and 110e in Y-direction.

The source/drain contacts 120a and 120b are formed over and in contact with the source/drain features (or source/drain regions) of the N-type transistor N5, and the source/drain contacts 120e and 120f are formed over and in contact with the source/drain features (or source/drain regions) of the N-type transistor N6. The source/drain contacts 120c and 120d are formed over and in contact with the source/drain features (or source/drain regions) of the P-type transistor P5, and the source/drain contacts 120g and 120h are formed over and in contact with the source/drain features (or source/drain regions) of the P-type transistor P6.

In the logic cell 15D, each of the source/drain contacts 120a through 120h is a shorter contact and has a rectangular shape which has a longer side along the Y-direction and a shorter side along the X-direction. In some embodiments, the source/drain contacts 120a through 120h have the same length L2 in the Y-direction and the same width in the X-direction, and the length L2 is less than the length L1.

In the logic cell 15D, the gate structures 110b and 110d are electrically connected to the metal line 1503 through the connecting features (e.g., the gate via) 130a and 130b, respectively. The metal lines 150_1 through 150_5 are signal lines for the P-type transistors P5 and P6 and the N-type transistors N5 and N6. The source/drain contact 120a is electrically connected to the metal line 150_1b through the connecting feature 125a, and the source/drain contact 120b is electrically connected to the metal line 150_1a through the connecting feature 125b. The metal lines 150_1a and 150_1b are arranged on the same straight line. For example, the metal lines 150_1a and 150_1b are formed by performing a metal-cutting process on one metal line.

The source/drain contact 120e is electrically connected to the metal line 150_2b through the connecting feature 125e, and the source/drain contact 120f is electrically connected to the metal line 150_2a through the connecting feature 125f. The metal lines 150_2c and 150_2d are arranged on the same straight line. The source/drain contact 120c is electrically connected to the metal line 150_5b through the connecting feature 125c, and the source/drain contact 120d is electrically connected to the metal line 150_5a through the connecting feature 125d. The metal lines 150_5a and 150_5b are arranged on the same straight line. The source/drain contact 120g is electrically connected to the metal line 150_4b through the connecting feature 125g, and the source/drain contact 120h is electrically connected to the metal line 150_4a through the connecting feature 125h. The metal lines 150_4a and 150_4b are arranged on the same straight line.

The distance between the connecting features 125b and 125d is equal to the distance between the connecting features 125a and 125c, i.e., the distance D5, and the distance D5 is greater than the distance D3. The distance between the connecting features 125e and 125g is equal to the distance between the connecting features 125f and 125h, i.e., the distance D6, and the distance D6 is less than the distance D3. In the logic cell 15D, the active regions of the P-type transistors P5 and P6 and the active regions of the N-type transistors N5 and N6 are arranged according to the connecting configuration of metal lines 150_1 through 1505 of the lowest metal layer.

Figure 10A:
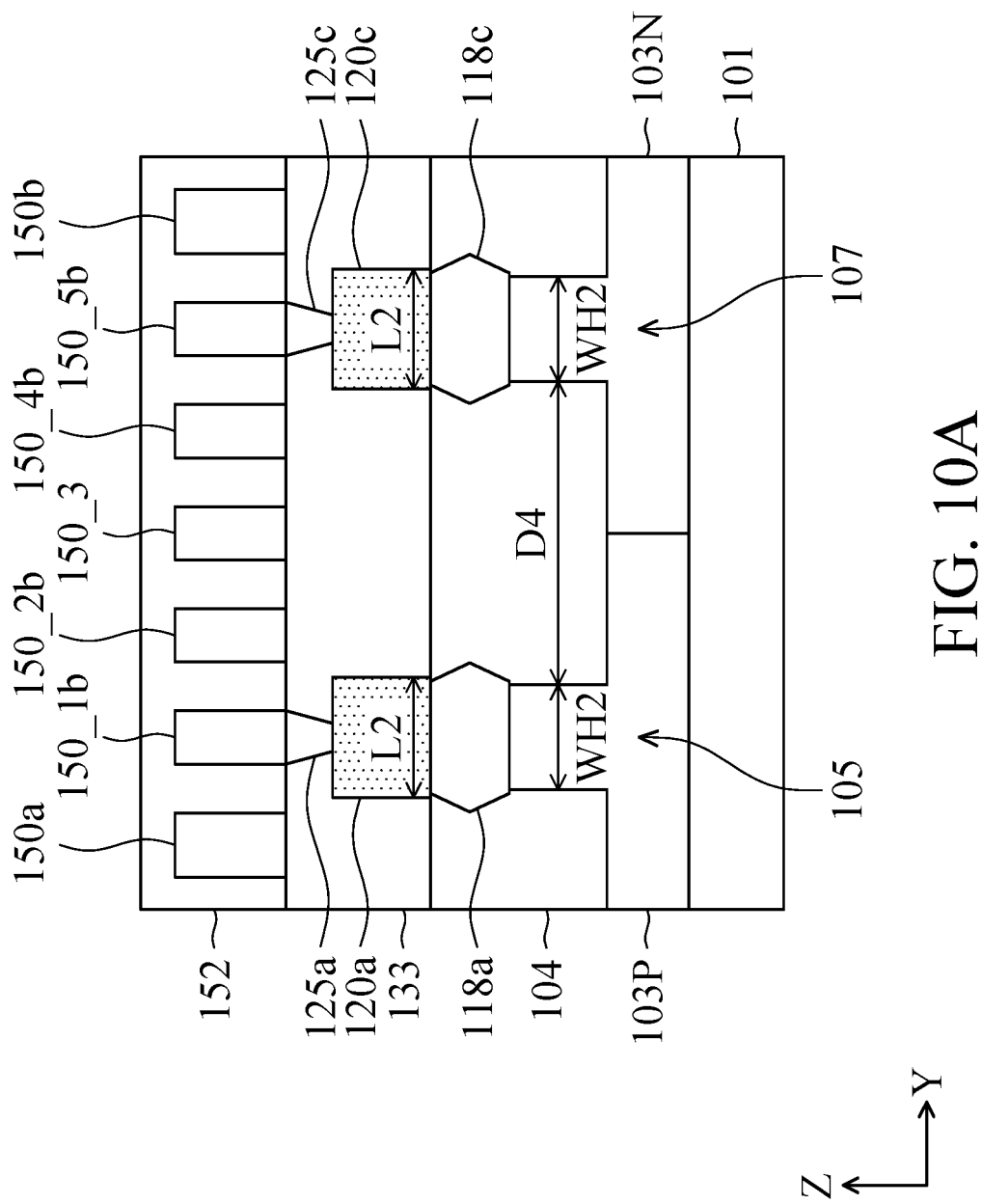
FIG. 10A is a cross sectional view illustrating a semiconductor structure of the logic cell along line H-H' in FIGS. 9A and 9B, in accordance with some embodiments of the disclosure.

FIG. 10A is a cross sectional view illustrating a semiconductor structure of the logic cell 15D along line H-H' in FIGS. 9A and 9B, in accordance with some embodiments of the disclosure. Features in FIG. 10A that are the same or similar to those in the GAA transistor of FIG. 2 are given the same reference numbers, and a detailed description thereof is thus omitted.

The fin base structure 105 corresponding to the active region 30 is formed over the P-type well region 103P, and the fin base structure 107 corresponding to the active region 35 is formed over the N-type well region 103N. The fin base structure 105 and 107 have a width of WH2 in the Y-direction. Furthermore, the distance between the fin base structures 105 and 107 is D4.

The source/drain feature 118a of the N-type transistor N5 is formed over the fin base structure 105. The source/drain feature 118c of the P-type transistor P5 is formed over the fin base structure 107. The source/drain contact 120a is formed over and in contact with the source/drain feature 118a, and the source/drain contact 120c is formed over and in contact with the source/drain feature 118c. In some embodiments, the length L2 of the contact 120a and 120c are substantially equal to the width WH2 of the fin base structures 105 and 107.

In FIG. 10A, the connecting feature 125a is formed over the source/drain contact 120a, and overlaps and contacts the metal line 150_1b in the Z-direction. The connecting feature 125c is formed over the source/drain contact 120c, and overlaps and contacts the metal line 150_5b in the Z-direction. The metal line 150_1b and the connecting feature 125a overlap the fin base structure 105 in the Z-direction, and the metal line 150_5b and the connecting feature 125c overlap the fin base structure 107 in the Z-direction. Compared with a traditional logic cell, the signal path corresponding to the metal line 150_1b and the signal path corresponding to the metal line 150_5b have the shortest path from the lowest metal layer to the device, thereby decreasing the parasitic capacitance between different conductive features and decreasing resistance in the signal path.

Figure 10B:
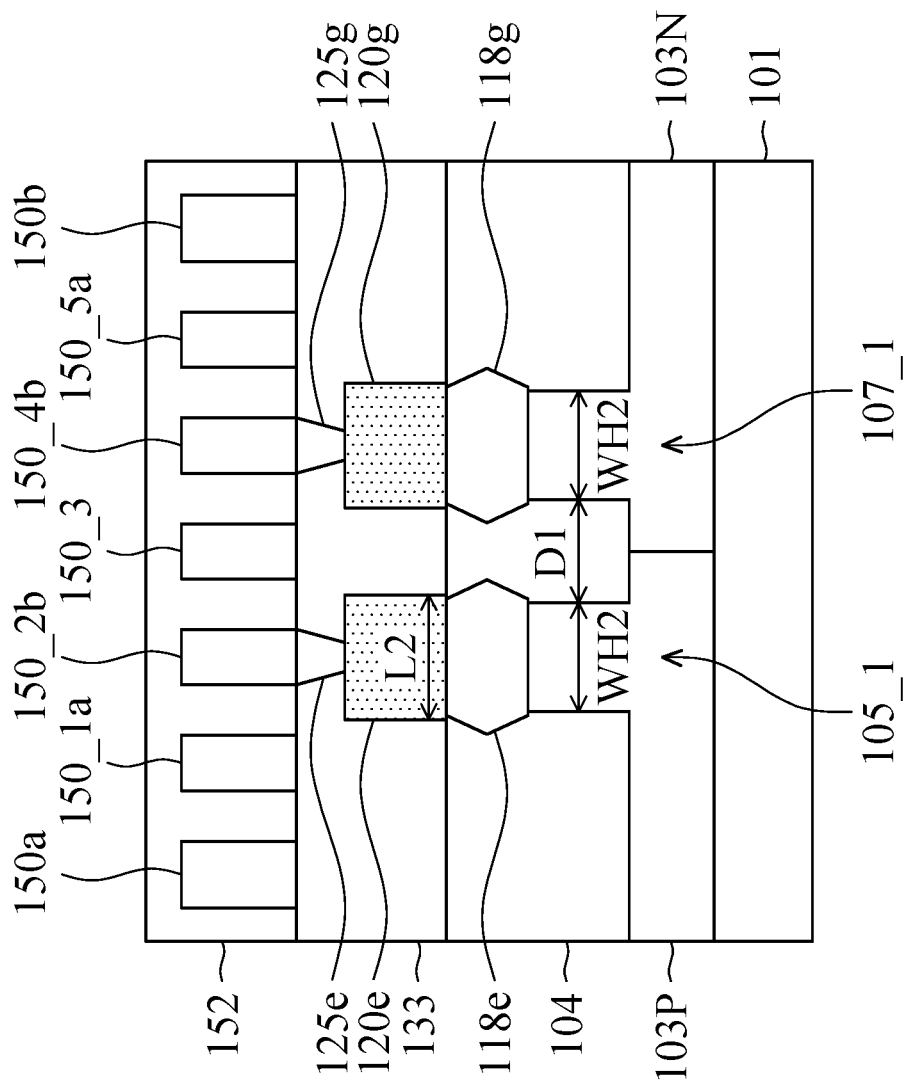
FIG. 10B shows a cross sectional view illustrating a semiconductor structure of the logic cell along line I-I' in FIGS. 9A and 9B, in accordance with some embodiments of the disclosure.

FIG. 10B shows a cross sectional view illustrating a semiconductor structure of the logic cell 15D along line I-I' in FIGS. 9A and 9B, in accordance with some embodiments of the disclosure. Features in FIG. 10B that are the same or similar to those in the GAA transistor of FIG. 2 are given the same reference numbers, and a detailed description thereof is thus omitted.

The fin base structure 105_1 corresponding to the active region 30_1 is formed over the P-type well region 103P, and the fin base structure 107_1 corresponding to the active region 35_1 is formed over the N-type well region 103N. The fin base structure 105_1 and 107_1 have a width of WH2 in the Y-direction. Furthermore, the distance between the fin base structures 105_1 and 107_1 is D1.

The source/drain feature 118e of the N-type transistor N6 is formed over the fin base structure 105_1. The source/drain feature 118g of the P-type transistor P6 is formed over the fin base structure 107_1. The source/drain contact 120e is formed over and in contact with the source/drain feature 118e, and the source/drain contact 120g is formed over and in contact with the source/drain feature 118g. In some embodiments, the length L2 of the contact 120e and 120g are substantially equal to the width WH2 of the fin base structures 105_1 and 107_1.

In FIG. 10B, the connecting feature 125e is formed over the source/drain contact 120e, and overlaps and contacts the metal line 150_2b in the Z-direction. The connecting feature 125g is formed over the source/drain contact 120g, and overlaps and contacts the metal line 150_4b in the Z-direction. The metal line 150_2b and the connecting feature 125e overlap the fin base structure 105_1 in the Z-direction, and the metal line 150_4b and the connecting feature 125g overlap the fin base structure 107_1 in the Z-direction. Compared with a traditional logic cell, the signal path corresponding to the metal line 150_2b and the signal path corresponding to the metal line 150_4b have the shortest path from the lowest metal layer to the device, thereby decreasing the parasitic capacitance between different conductive features and decreasing resistance in the signal path.

Embodiments of the logic cells are provided. The logic cells 15A, 15B, 15C and 15D may be arranged in the same row or different rows of the cell array. In the cell array, the active region is arranged according to the connecting configuration of metal lines of the lowest metal layer, e.g., the position of each device (especially small size transistors) is disposed directly under the corresponding metal line in the lowest metal layer, so as to decrease the parasitic capacitance between different conductive features and decrease resistance in the signal path, that optimizes the performance of the logic cells (i.e., the standard cells).

In some embodiments, a semiconductor structure is provided. A logic cell includes a first nanostructure transistor and a second nanostructure transistor. The first nanostructure transistor is formed in a first active region over a first well region having a first conductivity type. The second nanostructure transistor is formed in a second active region over a second well region having a second conductivity type. The first and second nanostructure transistors share a gate structure extending in a first direction. First and second source/drain features of the first nanostructure transistor are formed in the first active region, and third and fourth source/drain features of the second nanostructure transistor are formed in a first portion and a second portion of the second active region, respectively. A first distance between the first active region and the first portion of the second active region is different from a second distance between the first active region and the second portion of the second active region.

In some embodiments, a semiconductor structure is provided. A logic cell includes a first nanostructure transistor and a second nanostructure transistor. The first nanostructure transistor is formed in a first active region over a first well region having a first conductivity type. The second nanostructure transistor is formed in a second active region over the first well region. The first nanostructure transistor is separated from the second nanostructure transistor by a gate structure extending in a first direction. First and second source/drain features of the first nanostructure transistor are formed in the first active region, and third and fourth source/drain features of the second nanostructure transistor are formed in a first portion and a second portion of the second active region, respectively. The first active region is greater than the first and second portions of the second active region in the first direction.

In some embodiments, a semiconductor structure is provided. A logic cell includes a first nanostructure transistor, a second nanostructure transistor, a third nanostructure transistor and a fourth nanostructure transistor. The first nanostructure transistor is formed in a first active region over a first well region having a first conductivity type. The second nanostructure transistor is formed in a second active region over a second well region having a second conductivity type. The third nanostructure transistor is formed in a third active region over the first well region. The fourth nanostructure transistor is formed in a fourth active region over the second well region. The first and second nanostructure transistors share a first gate structure extending in a first direction, and the third and fourth nanostructure transistors share a second gate structure extending in the first direction. A first distance between the first active region and the second active region is different from a second distance between the third active region and the fourth active region, and the first, second, third and fourth active regions have the same width in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a logic cell, comprising:
      a first nanostructure transistor formed in a first active region over a first well region having a first conductivity type; and
      a second nanostructure transistor formed in a second active region over a second well region having a second conductivity type,
   wherein the first and second nanostructure transistors share a gate structure extending in a first direction,
   wherein first and second source/drain features of the first nanostructure transistor are formed in the first active region, and third and fourth source/drain features of the second nanostructure transistor are formed in a first portion and a second portion of the second active region, respectively,
   wherein a first distance between the first active region and the first portion of the second active region is different from a second distance between the first active region and the second portion of the second active region.

2. The semiconductor structure as claimed in claim 1, wherein the first active region is greater than the first and second portions of the second active region in the first direction.

3. The semiconductor structure as claimed in claim 1, wherein the first and second source/drain features of the first nanostructure transistor are formed on opposite sides of the gate structure, and the third and fourth source/drain features of the second nanostructure transistor are disposed on opposite sides of the gate structure.

4. The semiconductor structure as claimed in claim 1, wherein the logic cell further comprises:
   first, second, third and fourth source/drain contacts extending in the first direction, and directly contacting first, second, third and fourth source/drain features, respectively,
   wherein the first, second, third and fourth source/drain contacts have the same length in the first direction,
   wherein the third source/drain contact does not overlap the second portion of the second active region, and the fourth source/drain contact does not overlap the first portion of the second active region.

5. The semiconductor structure as claimed in claim 1, further comprising:
a plurality of metal lines formed in the same metal layer and extending in a second direction that is perpendicular to the first direction, and comprising:
a first metal line and a second metal line overlapping the first active region;
a third metal line overlapping the first portion of the second active region; and
a fourth metal line overlapping the second portion of the second active region.

6. The semiconductor structure as claimed in claim 5, wherein the third metal line does not overlap the second portion of the second active region, and the fourth metal line does not overlap the first portion of the second active region.

7. The semiconductor structure as claimed in claim 5, wherein the logic cell further comprises:
a first source/drain contact extending in the first direction, wherein the first source/drain contact is in contact with the first source/drain feature and is electrically connected to the first metal line through a first connecting feature;
a second source/drain contact extending in the first direction, wherein the second source/drain contact is in contact with the second source/drain feature and is electrically connected to the second metal line through a second connecting feature;
a third source/drain contact extending in the first direction, wherein the third source/drain contact is in contact with the third source/drain feature and is electrically connected to the third metal line through a third connecting feature; and
a fourth source/drain contact extending in the first direction, wherein the fourth source/drain contact is in contact with the fourth source/drain feature and is electrically connected to the fourth metal line through a fourth connecting feature,
wherein a distance between the first and third connecting features is equal to a distance between the second and fourth connecting features in the first direction.

8. The semiconductor structure as claimed in claim 7, wherein the third source/drain contact does not overlap the second portion of the second active region, and the fourth source/drain contact does not overlap the first portion of the second active region.

9. A semiconductor structure, comprising:
a logic cell, comprising:
a first nanostructure transistor formed in a first active region over a first well region having a first conductivity type; and
a second nanostructure transistor formed in a second active region over the first well region,
wherein the first nanostructure transistor is separated from the second nanostructure transistor by a gate structure extending in a first direction,
wherein first and second source/drain features of the first nanostructure transistor are formed in the first active region, and third and fourth source/drain features of the second nanostructure transistor are formed in a first portion and a second portion of the second active region, respectively,
wherein the first active region is greater than the first and second portions of the second active region in the first direction.

10. The semiconductor structure as claimed in claim 9, wherein a width of the first and second portions of the second active region is half a width of the first active region in the first direction.

11. The semiconductor structure as claimed in claim 9, wherein the logic cell further comprises:
first, second, third and fourth source/drain contacts extending in the first direction, and directly contacting the first, second, third and fourth source/drain features, respectively,
wherein the first, second, third and fourth source/drain contacts have the same length in the first direction,
wherein the third source/drain contact does not overlap the second portion of the second active region, and the fourth source/drain contact does not overlap the first portion of the second active region.

12. The semiconductor structure as claimed in claim 9, further comprising:
a plurality of metal lines formed in the same metal layer and extending in a second direction that is perpendicular to the first direction, and comprising:
a first metal line overlapping the first active region and the first portion of the second active region; and
a second metal line overlapping the first active region and the second portion of the second active region.

13. The semiconductor structure as claimed in claim 12, wherein the first metal line does not overlap the second portion of the second active region, and the second metal line does not overlap the first portion of the second active region.

14. The semiconductor structure as claimed in claim 12, wherein the logic cell further comprises:
a first source/drain contact extending in the first direction, wherein the first source/drain contact is in contact with the first source/drain feature and is electrically connected to the first metal line through a first connecting feature;
a second source/drain contact extending in the first direction, wherein the second source/drain contact is in contact with the second source/drain feature and is electrically connected to the second metal line through a second connecting feature;
a third source/drain contact extending in the first direction, wherein the third source/drain contact is in contact with the third source/drain feature and is electrically connected to the first metal line through a third connecting feature; and
a fourth source/drain contact extending in the first direction, wherein the fourth source/drain contact is in contact with the fourth source/drain feature and is electrically connected to the second metal line through a fourth connecting feature.

15. The semiconductor structure as claimed in claim 14, wherein the third source/drain contact does not overlap the second portion of the second active region, and the fourth source/drain contact does not overlap the first portion of the second active region.

16. A semiconductor structure, comprising:
a logic cell, comprising:
a first nanostructure transistor formed in a first active region over a first well region having a first conductivity type;
a second nanostructure transistor formed in a second active region over a second well region having a second conductivity type;
a third nanostructure transistor formed in a third active region over the first well region;

a fourth nanostructure transistor formed in a fourth active region over the second well region;

wherein the first and second nanostructure transistors share a first gate structure extending in a first direction, and the third and fourth nanostructure transistors share a second gate structure extending in the first direction, wherein a first distance between the first active region and the second active region is different from a second distance between the third active region and the fourth active region, and the first, second, third and fourth active regions have the same width in the first direction.

17. The semiconductor structure as claimed in claim 16, wherein first and second source/drain features of the first nanostructure transistor are formed in the first active region and on opposite sides of the first gate structure, and third and fourth source/drain features of the third nanostructure transistor are formed in the third active region and on opposite sides of the second gate structure.

18. The semiconductor structure as claimed in claim 17, further comprising:

a plurality of metal lines formed in the same metal layer and extending in a second direction that is perpendicular to the first direction, and comprising:

a first metal line overlapping and electrically connected to the first source/drain feature of the first nanostructure transistor;

a second metal line overlapping and electrically connected to the second source/drain feature of the first nanostructure transistor;

a third metal line overlapping and electrically connected to the third source/drain feature of the third nanostructure transistor; and a fourth metal line overlapping and electrically connected to the fourth source/drain feature of the third nanostructure transistor.

19. The semiconductor structure as claimed in claim 18, wherein the first metal line and the second metal line are arranged on the same straight line, and the third metal line and the fourth metal line are arranged on the same straight line.

20. The semiconductor structure as claimed in claim 16, wherein the first distance is greater than the second distance, and the first gate structure is longer than the second gate structure in the first direction.

* * * * *